(12) United States Patent
Cho et al.

(10) Patent No.: US 10,283,439 B2
(45) Date of Patent: May 7, 2019

(54) FAN-OUT SEMICONDUCTOR PACKAGE INCLUDING ELECTROMAGNETIC INTERFERENCE SHIELDING LAYER

(71) Applicant: SAMSUNG ELECTRO-MECHANICS CO., LTD., Suwon-Si, Gyeonggi-Do (KR)

(72) Inventors: Jung Hyun Cho, Suwon-Si (KR); Yong Ho Baek, Suwon-Si (KR); Jun Oh Hwang, Suwon-Si (KR); Joo Hwan Jung, Suwon-Si (KR); Moon Hee Yi, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/001,430

(22) Filed: Jun. 6, 2018

(65) Prior Publication Data

US 2018/0286790 A1 Oct. 4, 2018

Related U.S. Application Data

(63) Continuation of application No. 15/647,961, filed on Jul. 12, 2017, now Pat. No. 10,026,678.

(30) Foreign Application Priority Data

Dec. 22, 2016 (KR) .......................... 10-2016-0177127

(51) Int. Cl.
*H01L 23/495* (2006.01)
*H01L 23/31* (2006.01)
(Continued)

(52) U.S. Cl.
CPC .... *H01L 23/49503* (2013.01); *H01L 23/3107* (2013.01); *H01L 23/3677* (2013.01);
(Continued)

(58) Field of Classification Search
CPC .......... H01L 23/49503; H01L 23/3107; H01L 23/3677; H01L 23/5226; H01L 24/09;
(Continued)

(56) References Cited

U.S. PATENT DOCUMENTS

2006/0128069 A1 6/2006 Hsu
2009/0237900 A1 9/2009 Driguchi et al.
(Continued)

FOREIGN PATENT DOCUMENTS

EP 2265101 A1 12/2010
JP 2013-183015 A 12/2013
(Continued)

OTHER PUBLICATIONS

Notice of Allowance issued in related parent U.S. Appl. No. 15/647,961, dated Apr. 19, 2018.
(Continued)

*Primary Examiner* — Scott B Geyer
(74) *Attorney, Agent, or Firm* — Morgan Lewis & Bockius LLP

(57) ABSTRACT

A fan-out semiconductor package includes: a first connection member having a through-hole and having a passive component disposed in the first connection member; a semiconductor chip disposed in the through-hole of the first connection member and having an active surface having connection pads disposed therein and an inactive surface opposing the active surface; an encapsulant encapsulating at least portions of the first connection member and the inactive surface of the semiconductor chip; and a second connection member disposed on the first connection member and the active surface of the semiconductor chip. The first connection member and the second connection member include, respectively, redistribution layers electrically connected to the connection pads of the semiconductor chip, and
(Continued)

the passive component is electrically connected to the connection pads of the semiconductor chip through the redistribution layer of the second connection member.

10 Claims, 19 Drawing Sheets

(51) Int. Cl.
  *H01L 23/00* (2006.01)
  *H01L 23/522* (2006.01)
  *H01L 23/367* (2006.01)
  *H01L 23/538* (2006.01)
  *H01L 23/525* (2006.01)
(52) U.S. Cl.
  CPC ...... *H01L 23/5226* (2013.01); *H01L 23/5389* (2013.01); *H01L 24/09* (2013.01); *H01L 24/19* (2013.01); *H01L 24/20* (2013.01); *H01L 23/525* (2013.01); *H01L 2224/04105* (2013.01); *H01L 2224/12105* (2013.01); *H01L 2224/24195* (2013.01); *H01L 2924/10252* (2013.01); *H01L 2924/10253* (2013.01); *H01L 2924/10329* (2013.01); *H01L 2924/14* (2013.01); *H01L 2924/1431* (2013.01); *H01L 2924/1432* (2013.01); *H01L 2924/1433* (2013.01); *H01L 2924/1434* (2013.01); *H01L 2924/15172* (2013.01); *H01L 2924/19011* (2013.01); *H01L 2924/19041* (2013.01); *H01L 2924/19042* (2013.01); *H01L 2924/19105* (2013.01); *H01L 2924/3025* (2013.01); *H01L 2924/3511* (2013.01); *H01L 2924/37001* (2013.01)
(58) Field of Classification Search
  CPC . H01L 2924/15172; H01L 2924/19011; H01L 23/552; H01L 23/60; H01L 23/28; H01L 23/31; H01L 23/3121; H01L 23/3128; H01L 2924/15174; H01L 23/522
  See application file for complete search history.

(56) References Cited

U.S. PATENT DOCUMENTS

| | | |
|---|---|---|
| 2014/0070396 A1 | 3/2014 | Kyozuka et al. |
| 2014/0182895 A1 | 7/2014 | Lee et al. |
| 2014/0182897 A1 | 7/2014 | Lee et al. |
| 2014/0360765 A1 | 12/2014 | Kiwanami et al. |
| 2015/0084206 A1 | 3/2015 | Lin |
| 2015/0195907 A1 | 7/2015 | Chung et al. |
| 2015/0325509 A1 | 11/2015 | We et al. |
| 2016/0260695 A1 | 9/2016 | Chung et al. |
| 2016/0329272 A1 | 11/2016 | Geissler et al. |
| 2016/0336296 A1 | 11/2016 | Jeong |
| 2017/0005023 A1 | 1/2017 | Chen et al. |
| 2017/0018505 A1 | 1/2017 | Lin et al. |
| 2017/0062383 A1 | 3/2017 | Yee et al. |
| 2017/0084591 A1 | 3/2017 | Magnus |
| 2017/0287825 A1* | 10/2017 | Lee .................. H01L 23/49827 |

FOREIGN PATENT DOCUMENTS

| | | |
|---|---|---|
| JP | 2013-258431 A | 12/2013 |
| KR | 10-2013-0011171 A | 1/2013 |
| KR | 10-2016-0134435 A | 11/2016 |
| TW | 499823 B | 8/2002 |
| TW | 201429353 A | 7/2014 |
| TW | 201436660 A | 9/2014 |
| TW | 201528899 A | 7/2015 |

OTHER PUBLICATIONS

Korean Office Action dated Dec. 26, 2018 issued in Korean Patent Application No. 10-2016-0177127 (with English translation).
Office Action issued in Taiwanese Patent Application No. 106122511, dated Sep. 26, 2018 (English translation).

\* cited by examiner

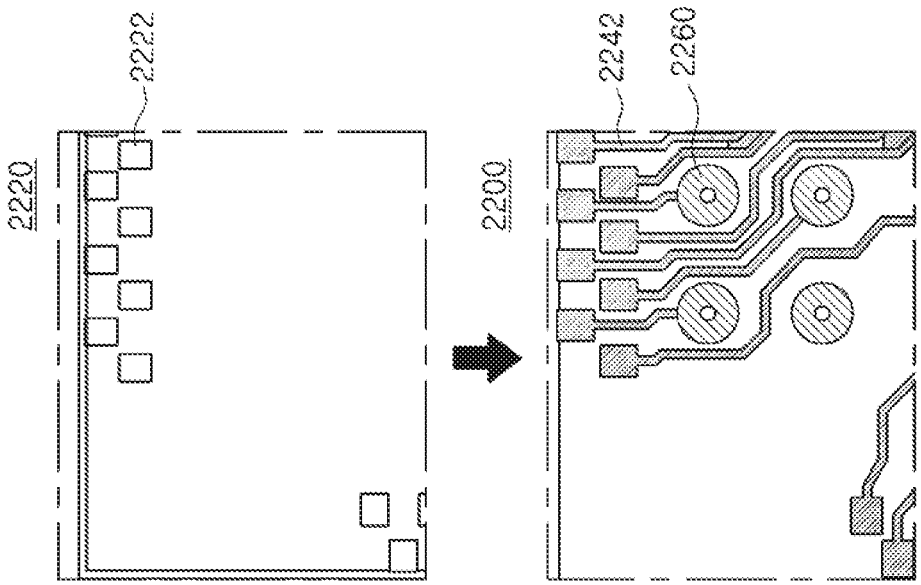
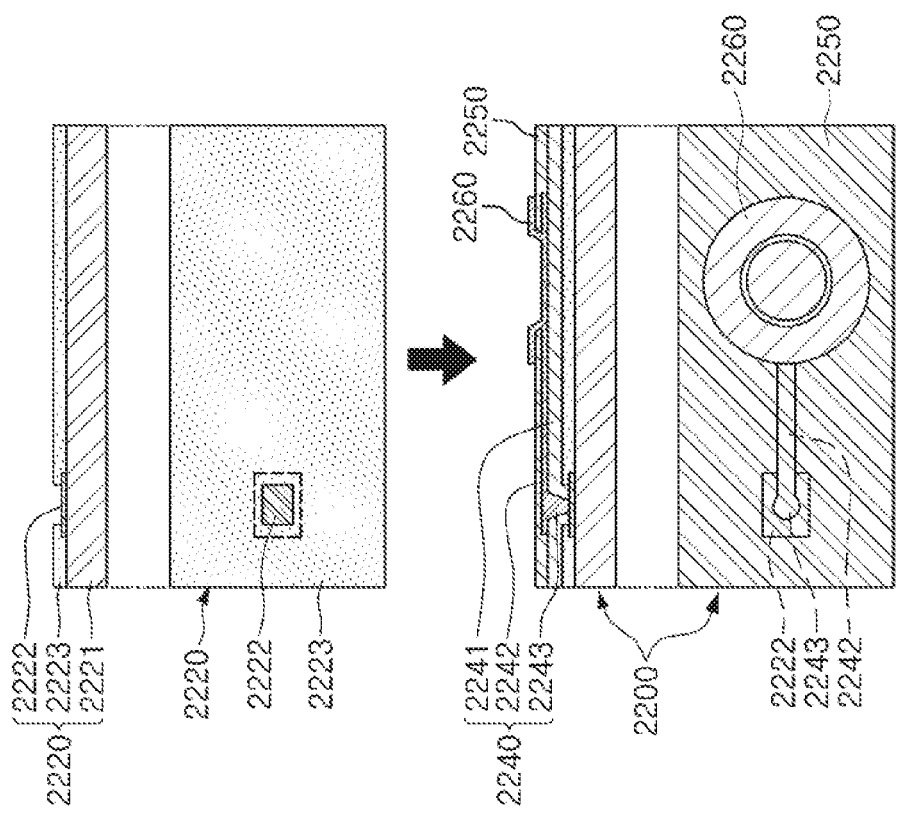
FIG. 3B
FIG. 3A

I-I'

II-II'

FAN-OUT SEMICONDUCTOR PACKAGE INCLUDING ELECTROMAGNETIC INTERFERENCE SHIELDING LAYER

CROSS-REFERENCE TO RELATED APPLICATION(S)

This application is a Continuation of U.S. patent application Ser. No. 15/647,961, filed on Jul. 12, 2017, which claims benefit of priority to Korean Patent Application No. 10-2016-0177127 filed on Dec. 22, 2016 in the Korean Intellectual Property Office, the disclosure of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size, while including a plurality of pins, has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a plurality of passive components may be mounted together with a semiconductor chip, a size and a thickness of the package may be significantly reduced even in the case that the plurality of passive components are mounted together with the semiconductor chip, and manufacturing costs and a defect rate may be significantly reduced.

According to an aspect of the present disclosure, a fan-out semiconductor package may be provided, in which a first connection member having a through-hole and having a redistribution layer formed therein is introduced, a semiconductor chip is disposed in the through-hole, a passive component is disposed in the first connection member, and the semiconductor chip and the passive component are electrically connected to each other by a redistribution layer of a second connection member.

According to an aspect of the present disclosure, a fan-out semiconductor package may include: a first connection member having a through-hole and having a passive component disposed in the first connection member; a semiconductor chip disposed in the through-hole of the first connection member and having an active surface having connection pads disposed therein and an inactive surface opposing the active surface; an encapsulant encapsulating at least portions of the first connection member and the inactive surface of the semiconductor chip; and a second connection member disposed on the first connection member and the active surface of the semiconductor chip. The first connection member and the second connection member include, respectively, redistribution layers electrically connected to the connection pads of the semiconductor chip, and the passive component is electrically connected to the connection pads of the semiconductor chip through the redistribution layer of the second connection member.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" encompasses the concepts of a physical connection and a physical disconnection. It can be understood that when an element is referred to using terms such as "first" and "second", the element is not limited thereby. They may be used only for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
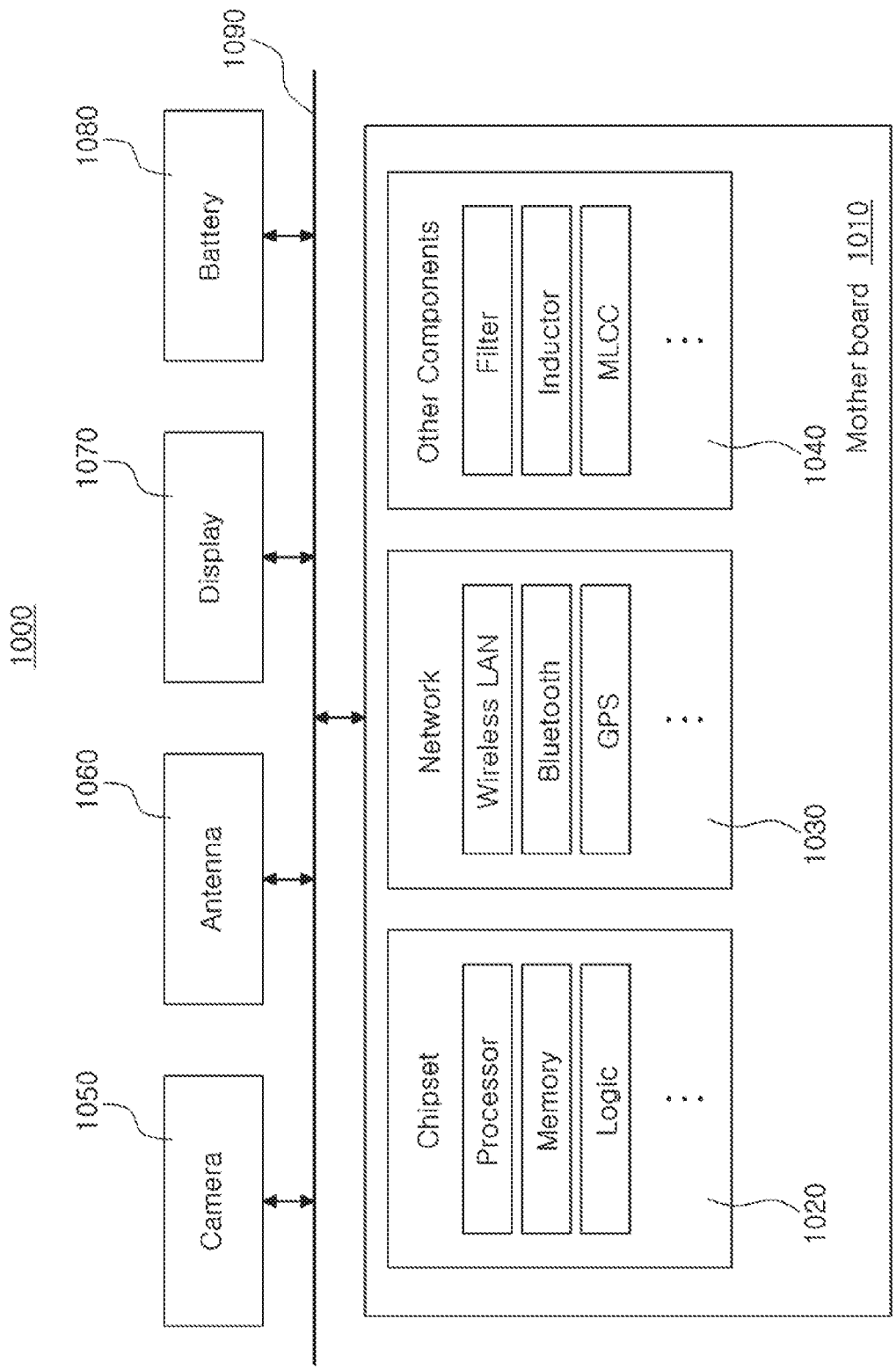
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
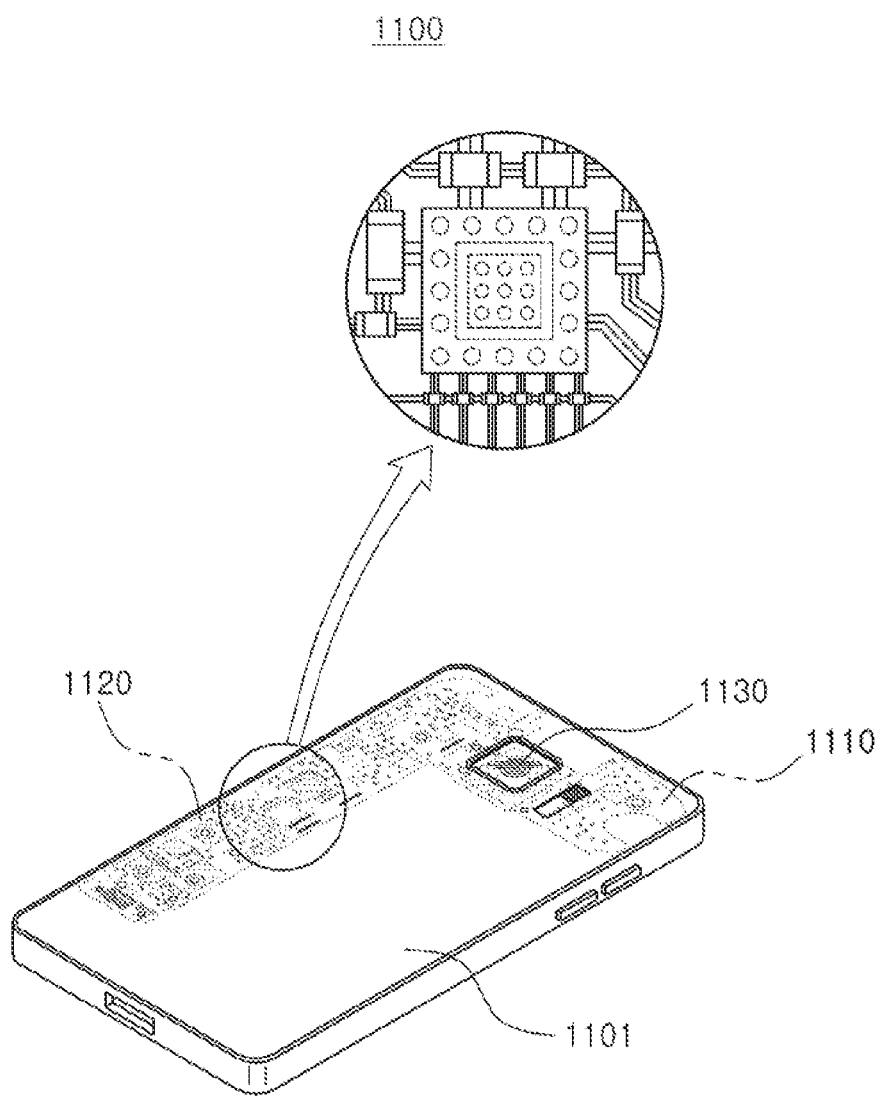
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required. A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
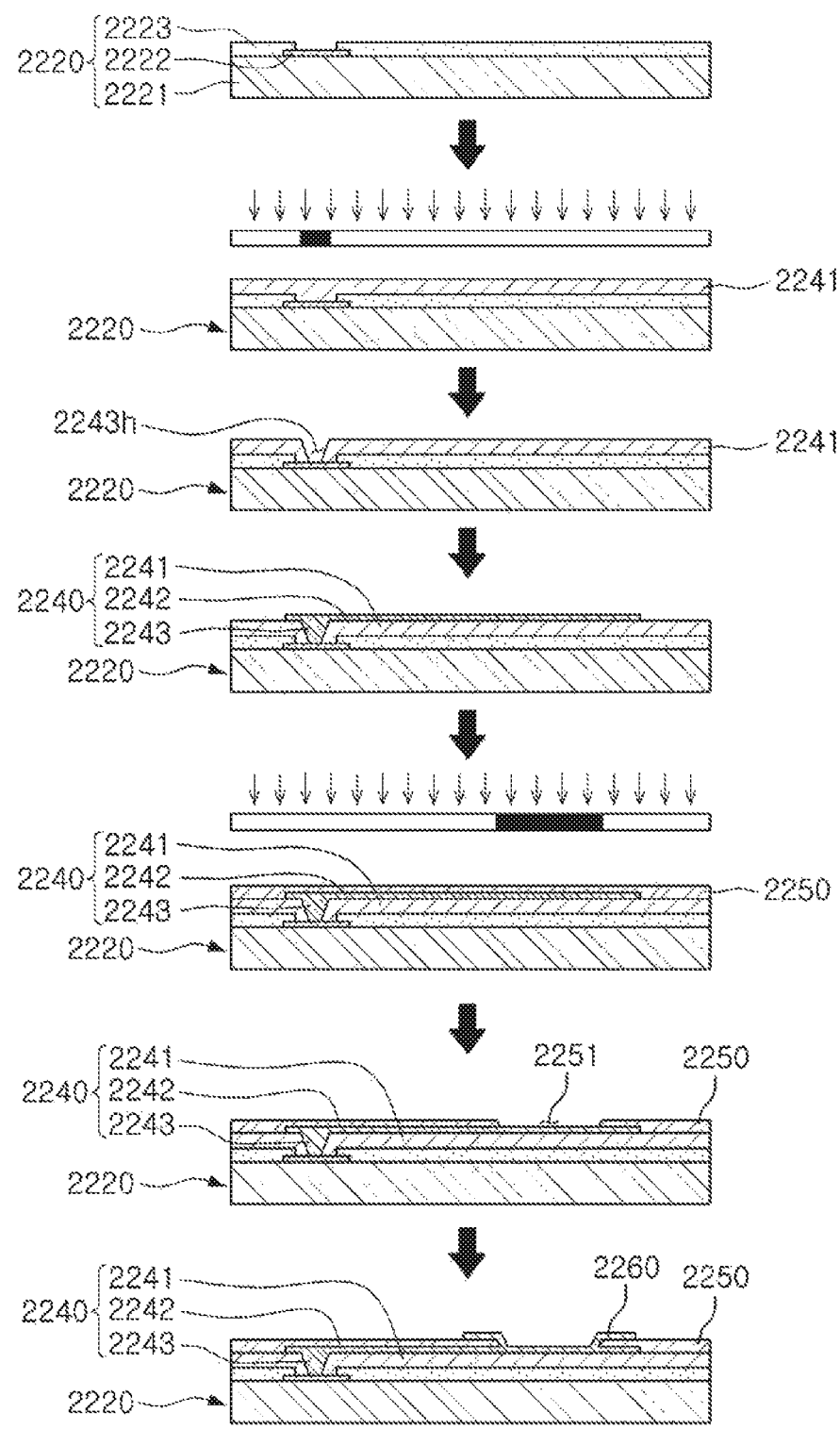
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it may be difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
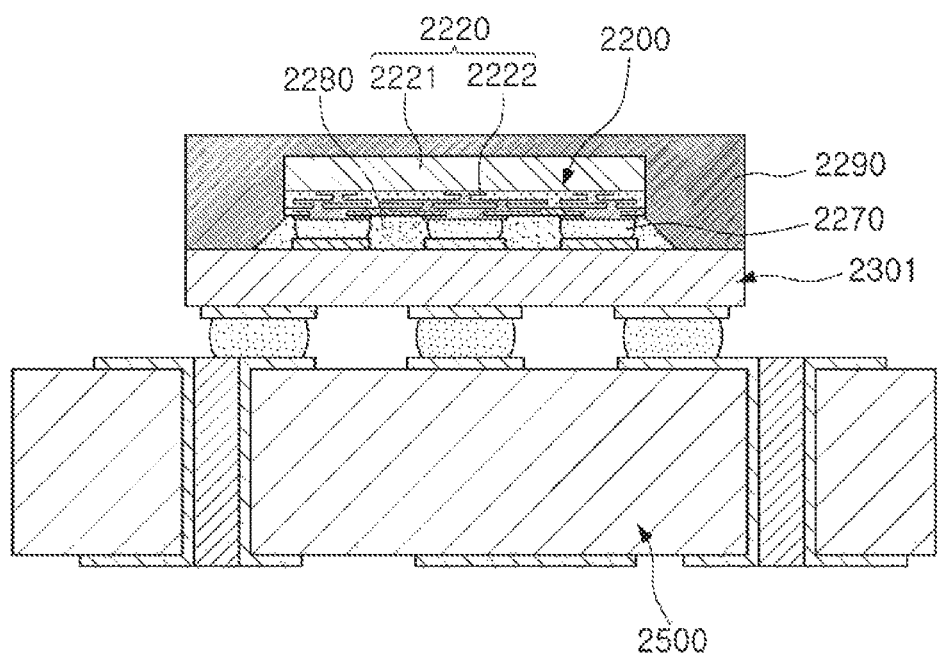
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
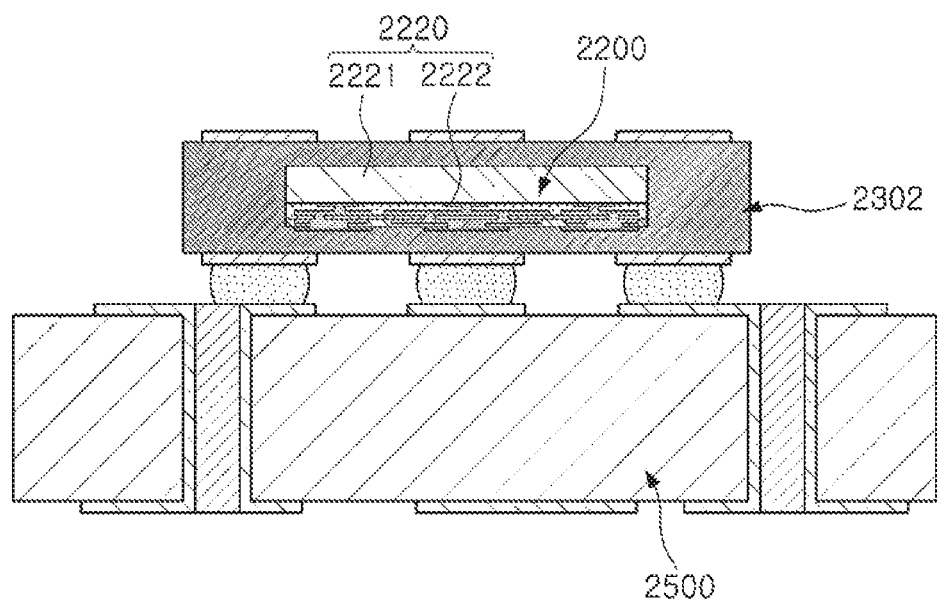
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
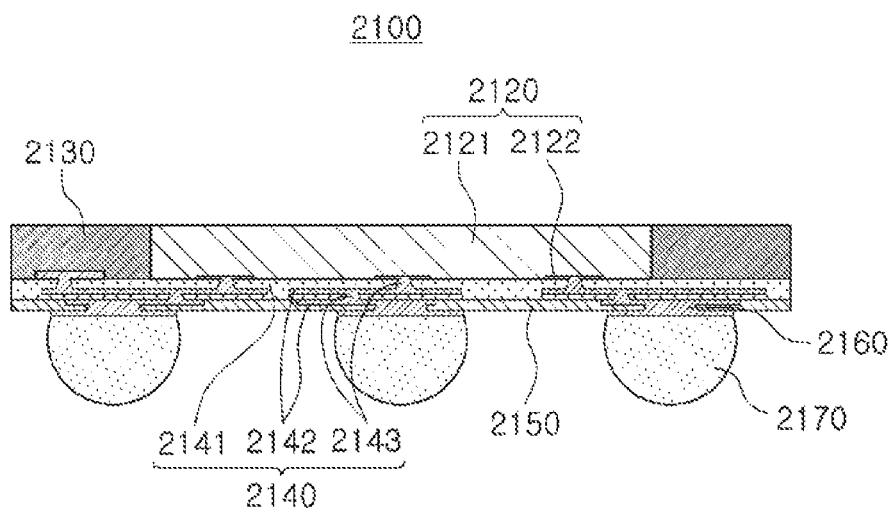
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
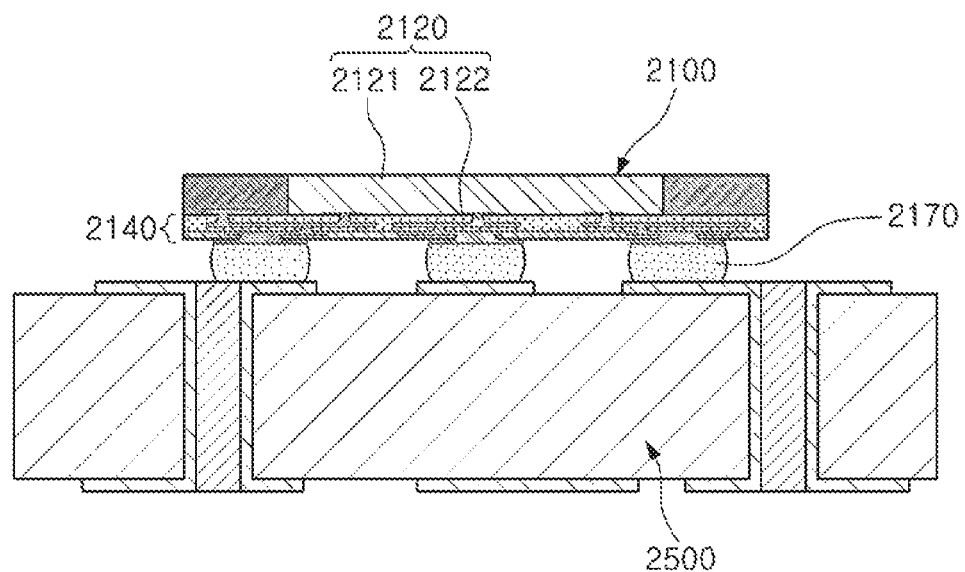
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a plurality of passive components may be mounted together with a semiconductor chip, a size and a thickness of the package may be significantly reduced even in the case that the plurality of passive components are mounted together with the semiconductor chip, and manufacturing costs and a defect rate may be significantly reduced will hereinafter be described with reference to the drawings.

Figure 9:
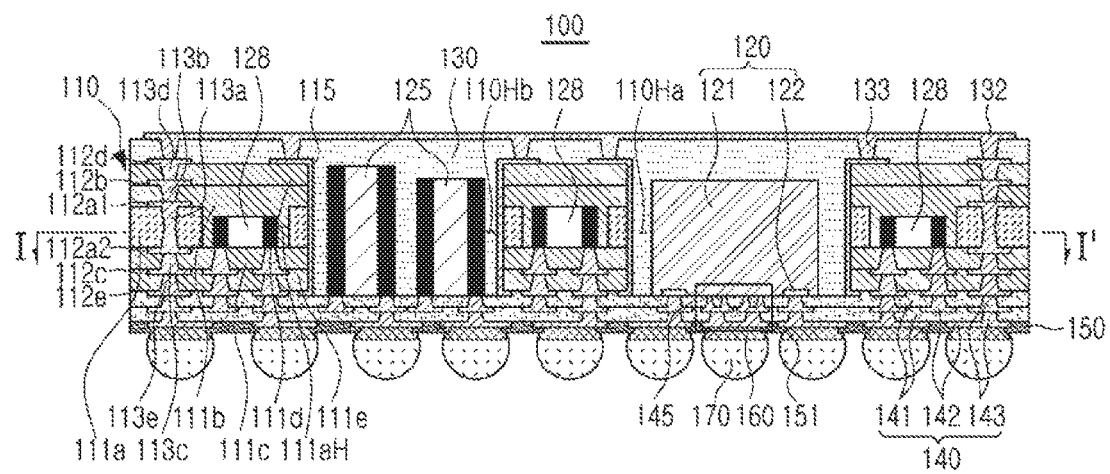
FIG. 9 is a schematic cross-sectional view illustrating an example of a fan-out semiconductor package.

FIG. 9 is a schematic cross-sectional view illustrating an example of a fan-out semiconductor package.

Figure 10:
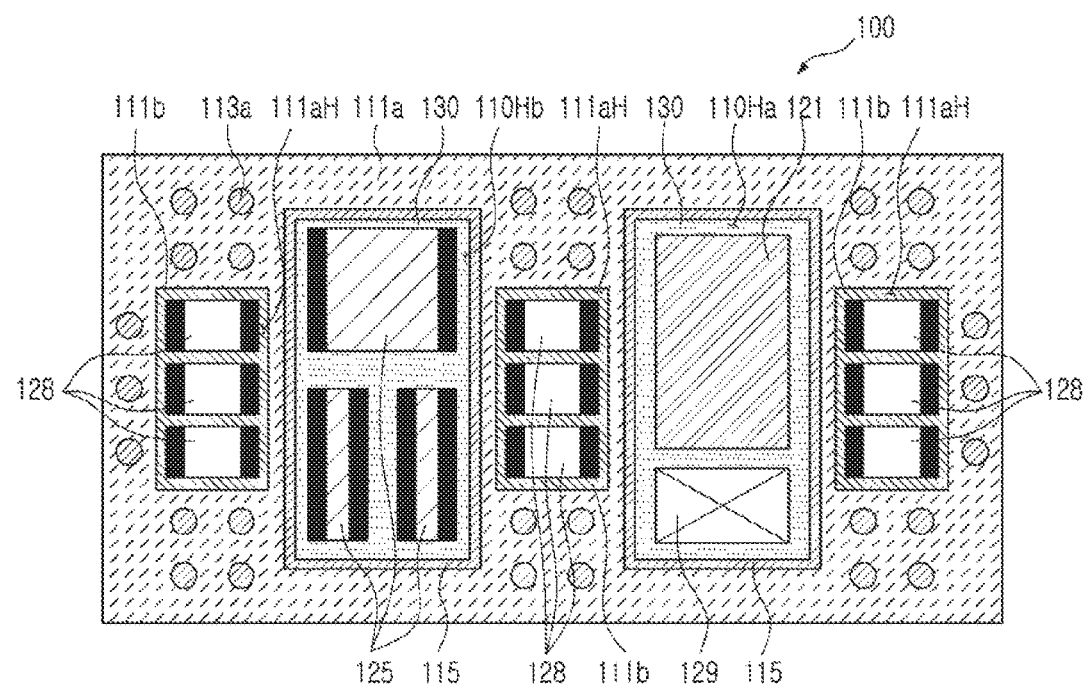
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100 according to an exemplary embodiment in the present disclosure, may include a first connection member 110 having first and second through-holes 110Ha and 110Hb and having first passive components 128 disposed therein, a semiconductor chip 120 disposed in the first through-hole 110Ha of the first connection member 110 and having an active surface having connection pads 122 disposed therein and an inactive surface opposing the active surface, second passive components 125 disposed in the second through-hole 110Hb of the first connection member 110 and having thicknesses greater than those of the first passive components 128, an encapsulant 130 encapsulating at least portions of the first connection member 110, the second passive components 125, and the inactive surface of the semiconductor chip 120, and a second connection member 140 disposed on the first connection member 110, the second passive components 125, and the active surface of the semiconductor chip 120. The first connection member 110 may include redistribution layers 112a1, 112a2, 112b, 112c, 112d, and 112e electrically connected to the connection pads 122 of the semiconductor chip 120. The second connection member 140 may also include redistribution layers 142 electrically connected to the connection pads 122 of the semiconductor chip 120. The first passive components 128 and the second passive components 125 may be electrically connected to the connection pads 122 of the semiconductor chip 120 through the redistribution layers 142 of the second connection member 140.

In general, semiconductor packages and passive components are mounted on a main board or a sub-board of information technology (IT) devices such as mobile devices, and the like. Therefore, there is a limitation in narrowing an interval between the components on the board, and particularly, several hundreds of small components are mounted on one board, and manufacturing costs and a defect rate are thus increased. In order to solve such a problem, a system in package (SIP) structure capable of reducing amounting area and improving surface mounting technology (SMT) efficiency by implementing semiconductor chips and the passive components in one package may be considered. However, in the SIP structure, an interposer substrate is generally used, and thus, there is a limitation in reducing a thickness of the package. Particularly, a plurality of passive components may have different thicknesses, and a thickness difference between the plurality of passive components and the semiconductor chips may be significant. Therefore, when the plurality of passive components are simply mounted on the interposer substrate, several problems such as a molding defect due to a thickness deviation, and the like, may occur.

On the other hand, in the fan-out semiconductor package 100 according to the exemplary embodiment, the second connection member 140 including the redistribution layers 142 that may redistribute the connection pads 122 disposed on the active surface of the semiconductor chip 120 up to a fan-out region may be formed, instead of introduction of the interposer substrate. Therefore, a thickness of the fan-out semiconductor package 100 may be significantly reduced. Further, the first connection member 110 including the redistribution layers 112a1, 112a2, 112b, 112c, 112d, and 112e that may redistribute the connection pads 122 of the semiconductor chip 120 may be introduced into an encapsulation region of the semiconductor chip 120 to thus significantly reduce the number of layers of the second connection member 140. Therefore, thinness of the redistribution layers of the second connection member may be possible, and a decrease in a yield due to a process defect may be suppressed.

Particularly, the fan-out semiconductor package 100 according to the exemplary embodiment may be packaged in a state in which the first passive components 128 having a relatively small thickness may be embedded in the first connection member 110 and the semiconductor chip 120 and the second passive components 125 having a relatively great thickness may be disposed in the first and second through-holes 110Ha and 110Hb of the first connection member 110, respectively. Therefore a problem such as a process defect occurring in a process of forming the encapsulant 130 due to a thickness deviation between the first passive components 128, and the semiconductor chip 120 and the second passive components 125 may be solved. In addition, the first passive components 128, and the semiconductor chip 120 and the second passive components 125 may be disposed side by side in spaces spaced apart from each other, respectively, and the fan-out semiconductor package 100 may be designed at a thickness as small as possible in spite of including a plurality of components.

Meanwhile, in the fan-out semiconductor package 100 according to the exemplary embodiment, the first connection member 110 may include a first insulating layer 111a having a through-hole 111aH, and the first passive components 128 may be disposed in the through-hole 111aH of the first insulating layer 111a. Therefore, the first passive components 128 may be stably embedded, and a thickness deviation problem at the time of forming a second insulating layer 112b encapsulating the first passive components 128 may be solved. In addition, the first insulating layer 111a may be formed of a material more rigid than a general build-up insulating layer to easily control warpage.

The respective components included in the fan-out semiconductor package 100 according to the exemplary embodiment will hereinafter be described in more detail.

The first connection member 110 may include the redistribution layers 112a1, 112a2, 112b, 112c, 112d, and 112e redistributing the connection pads 122 of the semiconductor chip 120 to thus reduce the number of layers of the second connection member 140. If necessary, the first connection member 110 may improve rigidity of the fan-out semiconductor package 100 depending on certain materials, and serve to secure uniformity of a thickness of the encapsulant 130. The fan-out semiconductor package 100 according to the exemplary embodiment may be utilized as a package-on-package (POP) type package by the first connection member 110. The first connection member 110 may have the first and second through-holes 110Ha and 110Hb. The semiconductor chip 120 may be disposed in the first through-hole 110Ha to be spaced apart from the first connection member 110 by a predetermined distance. The second passive components 125 may be disposed in the second through-hole 110Hb to be spaced apart from the first connection member 110 by a predetermined distance. Side surfaces of the semiconductor chips 120 and the second passive components 125 may be surrounded by the first connection member 110. However, such a form is only an example and may be variously modified to have other forms, and the first connection member 110 may perform another function depending on such a form.

The first connection member 110 may include the first insulating layer 111a having the through-hole 111aH in which the first passive components 128 are disposed, a first redistribution layer 112a1 and a second redistribution layer 112a2 disposed on opposite surfaces of the first insulating layer 111a, respectively, a second insulating layer 111b disposed on the first insulating layer 111a and covering the first redistribution layer 112a1, a third redistribution layer 112b disposed on the second insulating layer 111b, a third insulating layer 111c disposed on the first insulating layer 111a and covering the second redistribution layer 112a2, a fourth redistribution layer 112c disposed on the third insulating layer 111c, a fourth insulating layer 111d disposed on the second insulating layer 111b and covering the third redistribution layer 112b, a fifth redistribution layer 112d disposed on the fourth insulating layer 111d, a fifth insulating layer 111e disposed on the third insulating layer 111c and covering the fourth redistribution layer 112c, and a sixth redistribution layer 112e disposed on the fifth insulating layer 111e. The first and second redistribution layers 112a1 and 112a2 may be electrically connected to each other by first vias 113a penetrating through the first insulating layer 111a. The first and third redistribution layers 112a1 and 112b may be electrically connected to each other by second vias 113b penetrating through the second insulating layer 111b. The second and fourth redistribution layers 112a2 and 112c may be electrically connected to each other by third vias 113c penetrating through the third insulating layer 111c. The third and fifth redistribution layers 112b and 112d may be electrically connected to each other by fourth vias 113d penetrating through the fourth insulating layer 111d. The fourth and sixth redistribution layers 112c and 112e may be electrically connected to each other by fifth vias 113e penetrating through the fifth insulating layer 111e. The second insulating layer 111b may fill at least portions of the through-hole 111aH, and encapsulate at least portions of the first passive components 128. A metal layer 115 may be disposed on walls of the through-holes 110Ha and 110Hb of the first connection member 110, if necessary.

The first insulating layer 111a may have a thickness greater than those of the third to fifth insulating layers 111c, 111d, and 111e. The first insulating layer 111a may be relatively thick in order to maintain rigidity, and the third to fifth insulating layers 111c, 111d, and 111e, which are introduced in order to form a larger number of redistribution layers, may have relatively small thicknesses. Similarly, a thickness of the first insulating layer 111a may be greater than that of the second insulating layer 111b covering the first insulating layer 111a. Similarly, the first via 113a penetrating through the first insulating layer 111a may have a diameter greater than that of the second to fifth vias 113b, 113c, 113d, and 113e.

The redistribution layers 112a1, 112a2, 112b, and 112c formed in the first connection member 110 may be disposed on a level between the active surface and the inactive surface of the semiconductor chip 120. The reason is that the first connection member 110 may be formed at a thickness corresponding to that of the semiconductor chip 120. Thicknesses of the redistribution layers 112a1, 112a2, 112b, 112c, 112d, and 112e of the first connection member 110 may be greater than those of the redistribution layers 142 of the second connection member 140. Since the first connection member 110 may have a thickness equal to or greater than that of the semiconductor chip 120, the redistribution layers 112a1, 112a2, 112b, 112c, 112d, and 112e may also be formed to have large sizes. On the other hand, the redistribution layers 142 of the second connection member 140 may be formed at relatively small sizes for thinness.

A material of each of the insulating layers 111a, 111b, 111c, 111d, and 111e is not particularly limited. For example, an insulating material may be used as the material of each of the insulating layers 111a, 111b, 111c, 111d, and 111e. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. The insulating layers 111a, 111b, 111c, 111d, and 111e may be formed of the same or different insulating materials, and when the insulating layers 111a, 111b, 111c, 111d, and 111e are formed of the same insulating materials, boundaries between the insulating layers 111a, 111b, 111c, 111d, and 111e after the insulating materials are hardened may not be apparent.

The redistribution layers 112a1, 112a2, 112b, 112c, 112d, and 112e may serve to redistribute connection pads 122 of the semiconductor chip 120. In addition, the redistribution layers 112a1, 112a2, 112b, 112c, 112d, and 112e may also serve to redistribute the first passive components 128. A material of each of the redistribution layers 112a1, 112a2, 112b, 112c, 112d, and 112e may be a conductive material such as copper (Cu), aluminum (Al), silver (Ag), tin (Sn), gold (Au), nickel (Ni), lead (Pb), titanium (Ti), or alloys thereof. The redistribution layers 112a1, 112a2, 112b, 112c, 112d, and 112e may perform various functions depending on designs of their corresponding layers. For example, the redistribution layers 112a1, 112a2, 112b, 112c, 112d, and 112e may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a1, 112a2, 112b, 112c, 112d, and 112e may include via pads, and the like.

The vias 113a, 113b, 113c, 113d, and 113e may electrically connect the redistribution layers formed on different layers to each other, resulting in an electrical path in the first connection member 110. The first passive components 128 may be electrically connected to the redistribution layers 142 of the second connection member 142 through the vias 113a, 113b, 113c, 113d, and 113e. A material of each of the vias 113a, 113b, 113c, 113d, and 113e may be a conductive material. Each of the vias 113a, 113b, 113c, 113d, and 113e may be completely filled with the conductive material, or the conductive material may also be formed along a wall of each of via holes. Each of the vias 113a, 113b, 113c, 113d, and 113e may have a cylindrical shape, a sandglass shape, a tapered shape, and the like, depending on thicknesses or materials of the insulating layers.

The metal layer 115 may be formed on the walls of the through-holes 110Ha and 110Hb to surround the side surfaces of the semiconductor chips 120 and the second passive components 125. Therefore, a mutual interference problem of electromagnetic waves generated from the semiconductor chip 120, the second passive components 125, or the like, may be suppressed. The metal layer 115 may be formed of a metal having high thermal conductivity to improve a heat dissipation effect. A material of each of the metal layer 115 may be a conductive material such as copper (Cu), aluminum (Al), silver (Ag), tin (Sn), gold (Au), nickel (Ni), lead (Pb), titanium (Ti), or alloys thereof. The metal layer 115 may extend to an upper surface and a lower surface of the first connection member 110, and may be connected to a pattern layer 132 through vias 133 to be described below to surround most of the surfaces of the semiconductor chip 120 and/or the second passive components 125 except for lower surfaces of the semiconductor chip 120 and/or the second passive components 125. In this case, an electromagnetic wave blocking effect or a heat dissipation effect may be particularly excellent. The metal layer 115 may be electrically connected to ground (GND) patterns formed in the fan-out semiconductor package 100. That is, the metal layer 115 may serve as a ground (GND) in the fan-out semiconductor package 100.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, etc., a memory chip such as a volatile memory (for example, a DRAM), a non-volatile memory (for example, a ROM), a flash memory, etc., or a logic chip such as an analog-to-digital converter, an application-specific IC (ASIC), etc. In addition, the IC may also be an IC for managing power, such as a power management IC (PMIC), etc. A larger number of semiconductor chips than that illustrated in the drawings may be embedded in the fan-out semiconductor package 100.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer (not illustrated) exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer (not illustrated). An insulating layer (not illustrated), and the like, may be further disposed in other required positions.

The passive components 125 and 128 may be multilayer ceramic capacitors (MLCCs), low inductance chip capacitors (LICCs), inductors, or the like, respectively. In this case, the passive components 125 and 128 may have different sizes. In this case, for example, the first passive components 128 having the relatively small thickness may be embedded in the first connection member 110 and the second passive components 125 having the relatively great thickness may be disposed in the second through-hole 110Hb of the first connection member 110 to solve several problems due to a thickness deviation between the first passive components 128 and the second passive components 125. Larger or smaller numbers of passive components 125 and 128 than those illustrated in the drawings may be disposed, and the passive components 125 and 128 may be the same or different components.

A kind of electronic component 129 is not particularly limited. That is, the electronic component 129 may be an integrated chip (IC) such as a semiconductor chip or be a passive component. Alternatively, the electronic component 129 may be a dummy chip disposed in order to control warpage due to a difference between coefficients of thermal expansion (CTEs). Alternatively, the electronic component 129 may be a combination of the passive component and the dummy chip. The electronic component 129 may be disposed together with and side by side with the semiconductor chip 120 in the first through-hole 110Ha. However, the electronic component 129 is not limited thereto, but may also be disposed in a separate through-hole formed in the first connection member 110.

The encapsulant 130 may encapsulate at least portions of the first connection member 110, the semiconductor chip 120, the second passive components 125, and the like, and protect the first connection member 110, the semiconductor chip 120, the second passive components 125, and the like. An encapsulation form of the encapsulant 130 is not particularly limited, but may be a form in which the encapsulant 130 surrounds at least portions of the first connection member 110, the semiconductor chip 120, the second passive components 125, and the like. For example, the encapsulant 130 may cover the first connection member 110, the second passive components 125, and the inactive surface of the semiconductor chip 120, and fill at least portions of spaces between walls of the through-holes 110Ha and 110Hb, and the side surfaces of the semiconductor chip 120 and the side surfaces of the second passive components 125. The encapsulant 130 may fill the through-holes 110Ha and 110Hb to thus serve as an adhesive for fixing the semiconductor chip 120 and the second passive components 125 and reduce buckling of the semiconductor chip 120 and the second passive components 125 depending on certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which an insulating resin such as a thermosetting resin or a thermoplastic resin is impregnated in an inorganic filler and a core material such as a glass fiber (or a glass cloth or a glass fabric) may also be used as the insulating material, in order to control the warpage.

When a material including a glass fiber, an inorganic filler, and an insulating resin is used as the material of the encapsulant 130, warpage of the fan-out semiconductor package 100 may be effectively controlled without performing an additional process. In detail, the encapsulant 130 may include the glass fiber to maintain rigidity of the fan-out semiconductor package 100. In addition, the encapsulant 130 may include the inorganic filler, and a CTE may thus be adjusted. Therefore, occurrence of the warpage of the fan-out semiconductor package 100 due to mismatch between CTEs may be suppressed. Meanwhile, a material of the encapsulant 130 may encapsulate the first connection member 110, the second passive components 125, and the semiconductor chip 120 in a b-stage. Therefore, the insulating resin and the inorganic filler of the encapsulant 130 may be disposed in the spaces between the walls of the through-holes 110Ha and 110Hb, and the side surfaces of the semiconductor chip 120 and the side surfaces of the second passive components 125 as well as on the first connection member 110, the second passive components 125, and the inactive surface of the semiconductor chip 120. On the other hand, the glass fiber of the encapsulant 130 may be disposed on only the first connection member 110, the second passive components 125, and the inactive surface of the semiconductor chip 120. Rigidity of the fan-out semiconductor package 100 at an upper portion of the fan-out semiconductor package 100 may be maintained by disposing the glass fiber.

The second connection member 140 may redistribute the connection pads 122 of the semiconductor chip 120. Several ten to several hundred connection pads 122 of the semiconductor chip 120 having various functions may be redistributed by the second connection member 140, and may be physically or electrically connected to an external source through connection terminals 170 depending on the functions. The first passive components 128 embedded in the first connection member 110 and the second passive components 125 disposed in the second through-hole 110Hb may be electrically connected to the semiconductor chip 120 through the second connection member 140 even in the case that they are disposed side by side with the semiconductor chip 120. The second connection member 140 may include insulating layers 141, the redistribution layers 142 disposed on the insulating layers 141, and vias 143 penetrating through the insulating layers 141 and connecting the redistribution layers 142 to each other. The second connection member 140 may be formed of a single layer, or may be formed of a plurality of layers of which the number is greater than that illustrated in the drawings.

A heat dissipation part 145 may be formed in the second connection member 140. The heat dissipation part 145 may be connected to the active surface of the semiconductor chip 120, and may dissipate heat generated from the semiconductor chip 120 downwardly. The heat dissipation part 145 may include heat dissipation vias. The heat dissipation vias may be electrically insulated from signal patterns in the fan-out semiconductor package 100. The heat dissipation part 145 may include a conductive material such as copper (Cu), aluminum (Al), silver (Ag), tin (Sn), gold (Au), nickel (Ni), lead (Pb), titanium (Ti), or alloys thereof. The heat dissipation vias may be electrically connected to ground patterns in the fan-out semiconductor package 100, but are not limited thereto.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 122, or the like, formed on different layers to each other, resulting in an electrical path in the fan-out semiconductor package 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

A passivation layer 150 may protect the second connection member 140 from external physical or chemical damage, or the like. The passivation layer 150 may have openings exposing at least portions of the redistribution layer 142 of the second connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

An underbump metal layer 160 may improve connection reliability of the connection terminals 170. The underbump metal layer 160 may be connected to the redistribution layer 142 of the second connection member 140 exposed through the openings of the passivation layer 150. The underbump metal layer 160 may be formed in the openings of the passivation layer 150 by the known metallization method using the known conductive material such as a metal, but is not limited thereto.

The connection terminals 170 may be additionally configured to physically or electrically externally connect the fan-out semiconductor package 100. For example, the fan-out semiconductor package 100 may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The pattern layer 132 may be disposed on the encapsulant 130. The pattern layer 132 may cover the inactive surface of the semiconductor chip 120. The pattern layer 132 may cover upper portions of the second passive components 125. The pattern layer 132 may be connected to the metal layer 115 through the vias 133 to surround most of the surfaces of the semiconductor chip 120 and/or the second passive components 125 except for the lower surfaces of the semiconductor chip 120 and/or the second passive components 125. In this case, an electromagnetic wave blocking effect or a heat dissipation effect may be particularly excellent. The pattern layer 132 may include a conductive material such as copper (Cu), aluminum (Al), silver (Ag), tin (Sn), gold (Au), nickel (Ni), lead (Pb), titanium (Ti), or alloys thereof. The pattern layer 132 may be electrically connected to the ground (GND) patterns formed in the fan-out semiconductor package 100. That is, the pattern layer 132 may serve as the ground (GND) in the fan-out semiconductor package 100. The pattern layer 132 may also have redistribution patterns performing a signal function, if necessary.

The vias 133 may penetrate through the encapsulant 130, and may connect the pattern layer 132 to the redistribution layer 112d of the first connection member 110 or to the metal layer 115. Each of the vias 133 may also include a conductive material such as copper (Cu), aluminum (Al), silver (Ag), tin (Sn), gold (Au), nickel (Ni), lead (Pb), titanium (Ti), or alloys thereof. The vias 133 may be formed together with the pattern layer 132 when the pattern layer 132 is formed. Therefore, a boundary between the vias 133 and the pattern layer 132 may not be present. The vias 133 may also be connected to the inactive surface of the semiconductor chip 120, if necessary. A shape, or the like, of each of the vias 133 is not particularly limited.

FIGS. 11A through 11D are schematic views illustrating an example of processes of manufacturing the fan-out semiconductor package of FIG. 9.

Figure 11A:
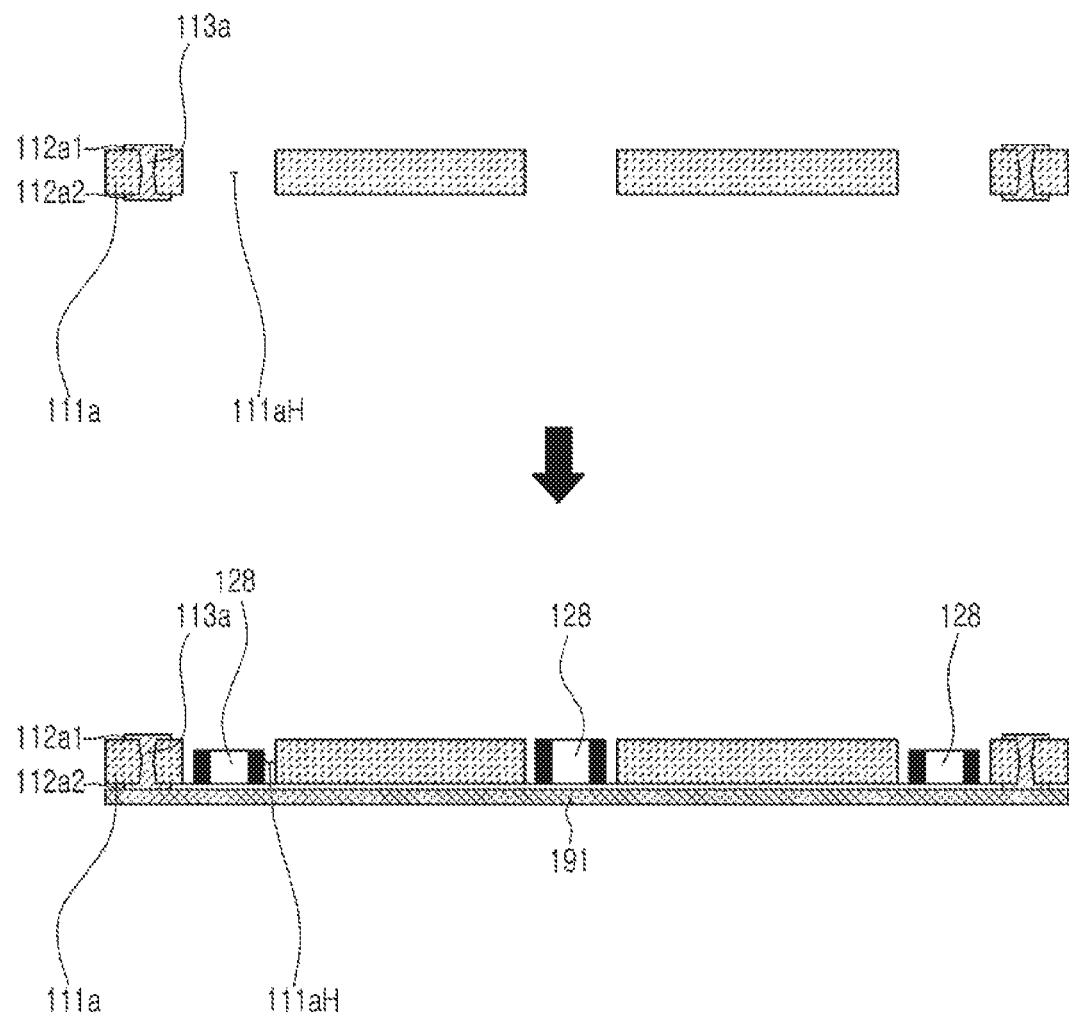
FIGS. 11A through 11D are schematic views illustrating an example of processes of manufacturing the fan-out semiconductor package of FIG. 9.

Referring to FIG. 11A, the first insulating layer 111a having the through-hole 111aH and having the first and second redistribution layers 112a1 and 112a2 disposed on the opposite surfaces thereof, respectively, and having the first vias 113a formed therein may be prepared. Then, an adhesive film 191 may be attached to the first insulating layer 111a. Then, the first passive components 128 may be attached to the adhesive film 191 exposed through the through-hole 111aH. The through-hole 111aH or holes for the first vias 113a may be formed using a laser drill, a mechanical drill, or the like. In addition, the first and second redistribution layers 112a1 and 112a2 and the first vias 113a may be formed by the known plating method such as electroplating, electroless plating, or the like, using a resist film.

Figure 11B:
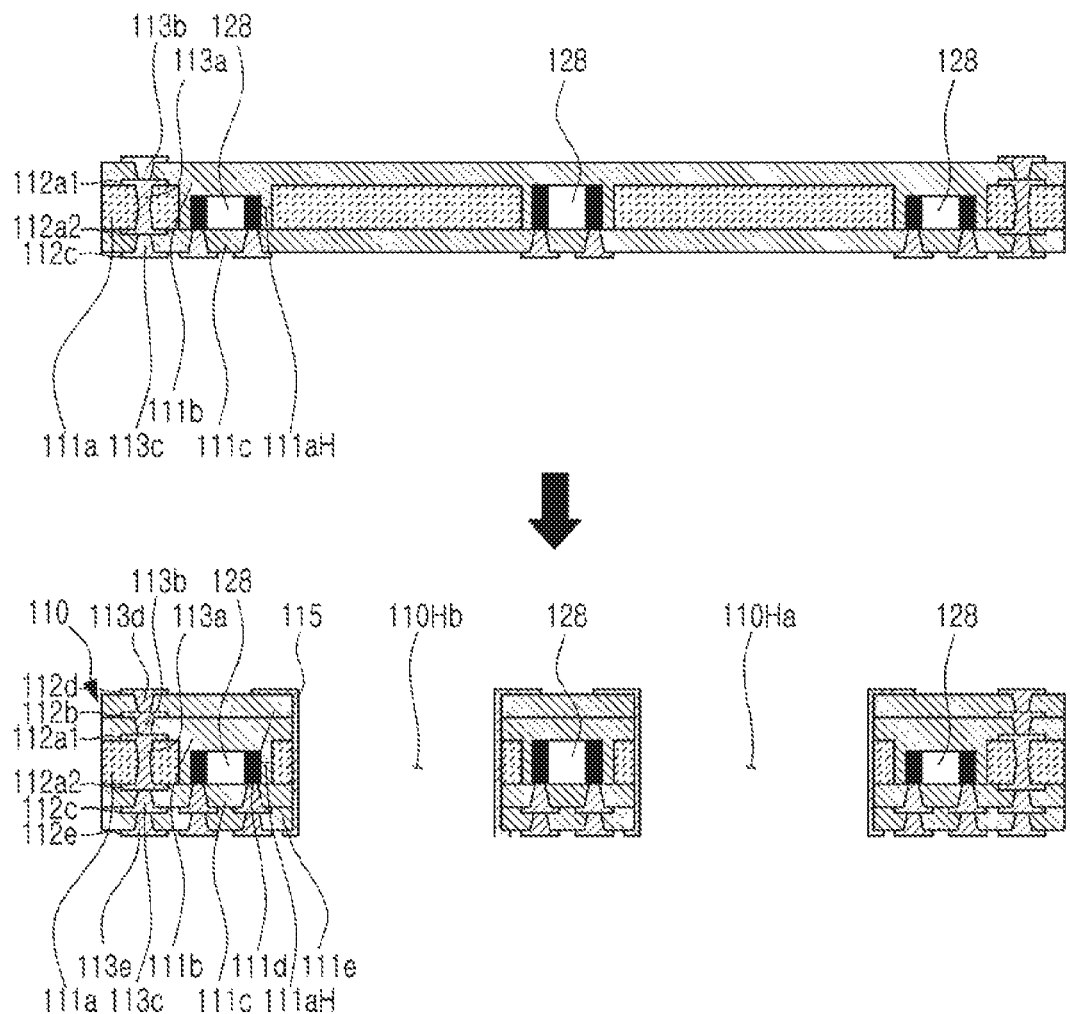

Then, referring to FIG. 11B, the second insulating layer 111b may be formed on the adhesive film 191 to encapsulate at least portions of the first passive components 128. Then, the adhesive film 191 may be peeled off, and the third insulating layer 111c may be formed in a region in which the adhesive film 191 is peeled off. Then, the third and fourth redistribution layers 112b and 112c may be formed on the second and third insulating layers 111b and 111c, respectively, and the second and third vias 113b and 113c may be formed in the second and third insulating layers 111b and 111c, respectively. Then, the fourth and fifth insulating layers 111d and 111e may be formed on the second and third insulating layers 111b and 111c, respectively. Then, the fifth and six redistribution layers 112d and 112e may be formed on the fourth and fifth insulating layers 111d and 111e, respectively, and the fourth and fifth vias 113d and 113e may be formed in the fourth and fifth insulating layers 111d and 111e, respectively. In addition, the first and second through-holes 110Ha and 110Hb may be formed. Then, the metal layer 115 may be formed. The second to fifth insulating layers 111b, 111c, 111d, and 111e may be formed by the known lamination method or applying method. The first and second through-holes 110Ha and 110Hb and holes for the second to fifth vias 113b, 113c, 113d, and 113e may be formed using a laser drill, a mechanical drill, photolithography, or the like. In addition, the third to sixth redistribution layers 112b, 112c, 112d, and 112e, the second to fifth vias 113b, 113c, 113d, and 113e, and the metal layer 115 may be formed by the known plating method such as electroplating, electroless plating, or the like, using a resist film.

Figure 11C:
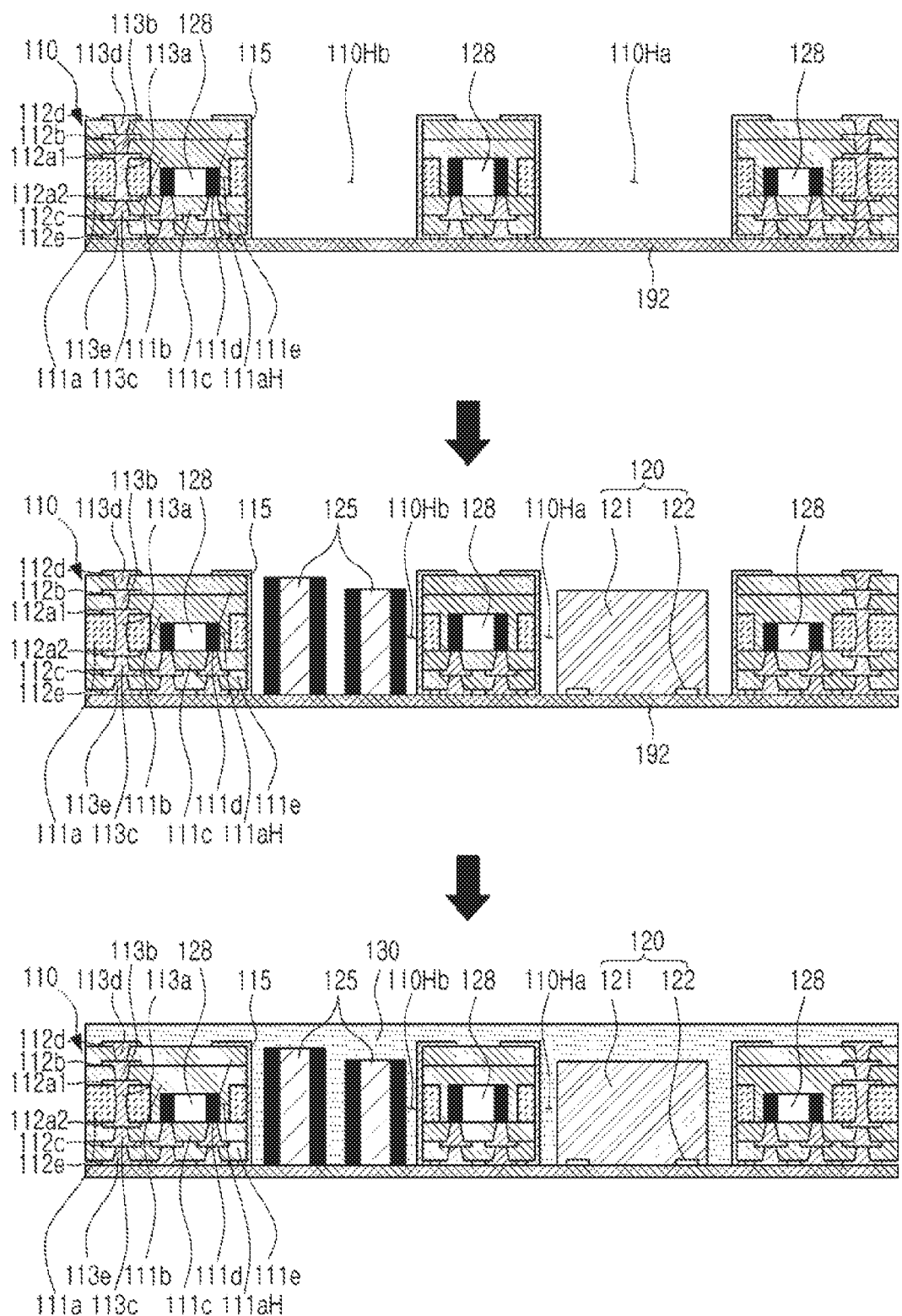

Then, referring to FIG. 11C, the manufactured first connection member 110 having the first and second through-holes 110Ha and 110Hb may be attached to an adhesive film 192. Then, the second passive components 125 and the semiconductor chip 120 may be attached to the adhesive film 192 exposed through the first and second through-holes 110Ha and 110Hb. The semiconductor chip 120 may be attached to the adhesive film 192 in a face-down form so that the active surface thereof is attached to the adhesive film 192, but is not limited thereto. Then, the second passive components 125 and the semiconductor chip 120 may be encapsulated using the encapsulant 130. The encapsulation may be performed by the known lamination method or applying method.

Figure 11D:
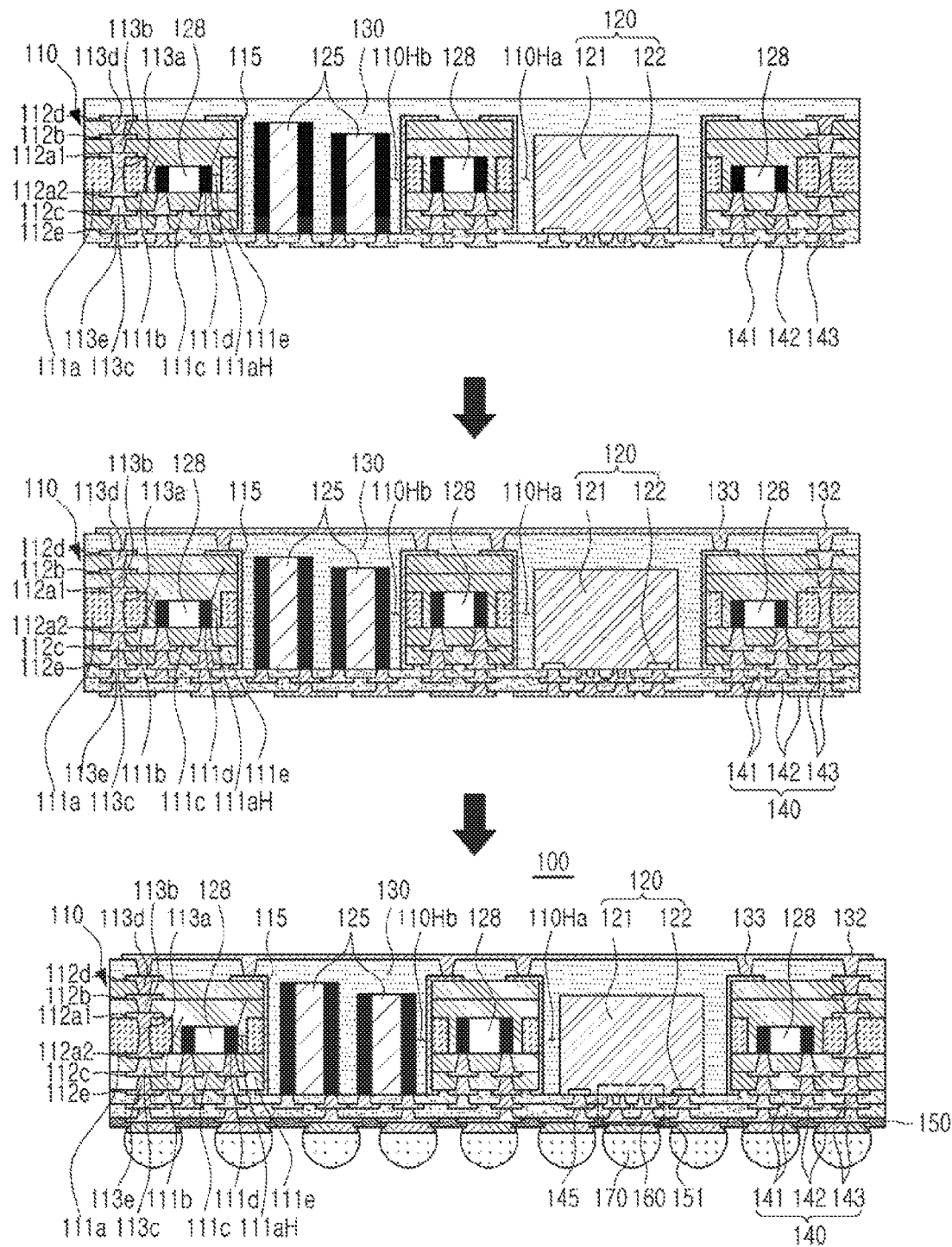

Then, referring to FIG. 11D, the adhesive film 192 may be peeled off, and the insulating layer 141, the redistribution layer 142, and the vias 143 may be formed in a region in which the adhesive film 192 is peeled off. Then, the insulating layer 141, the redistribution layer 142, and the vias 143 may further be formed once or more, if necessary. In addition, the pattern layer 132 and the vias 133 may be formed. Then, the passivation layer 150, the underbump metal layer 160, and the connection terminals 170 may be sequentially formed. The insulating layer 141 or the passivation layer 150 may be formed by the known lamination method, applying method, or the like, holes for the vias 143 and the vias 133 may be formed using a laser drill, a mechanical drill, photolithography, or the like, and the redistribution layer 142, the vias 143, the pattern layer 132, and the vias 133 may be formed by the known plating method such as electroplating, electroless plating, or the like, using a resist film. The underbump metal layer 160 may be formed by the known metallization method. The fan-out semiconductor package 100 may be manufactured through a series of processes.

Figure 12:
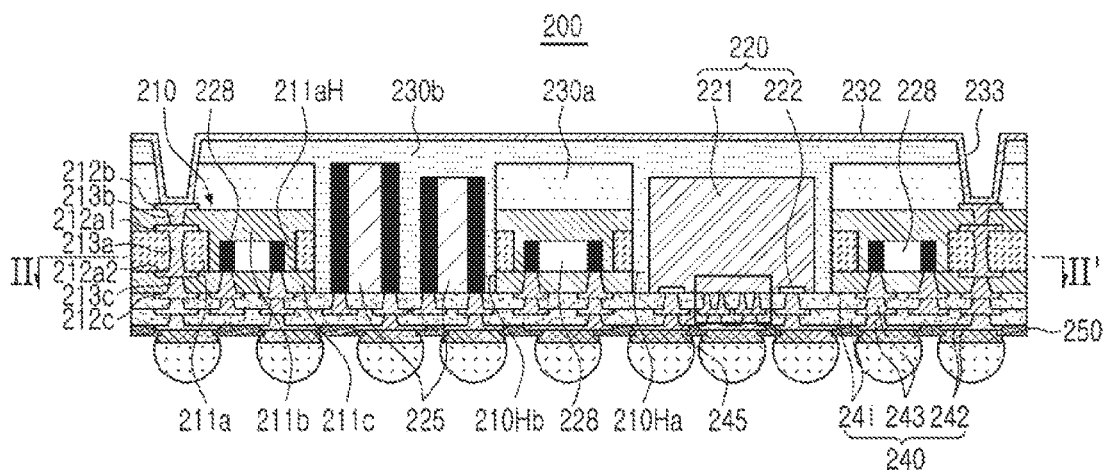
FIG. 12 is a schematic cross-sectional view illustrating another example of a fan-out semiconductor package.

FIG. 12 is a schematic cross-sectional view illustrating another example of a fan-out semiconductor package.

Figure 13:
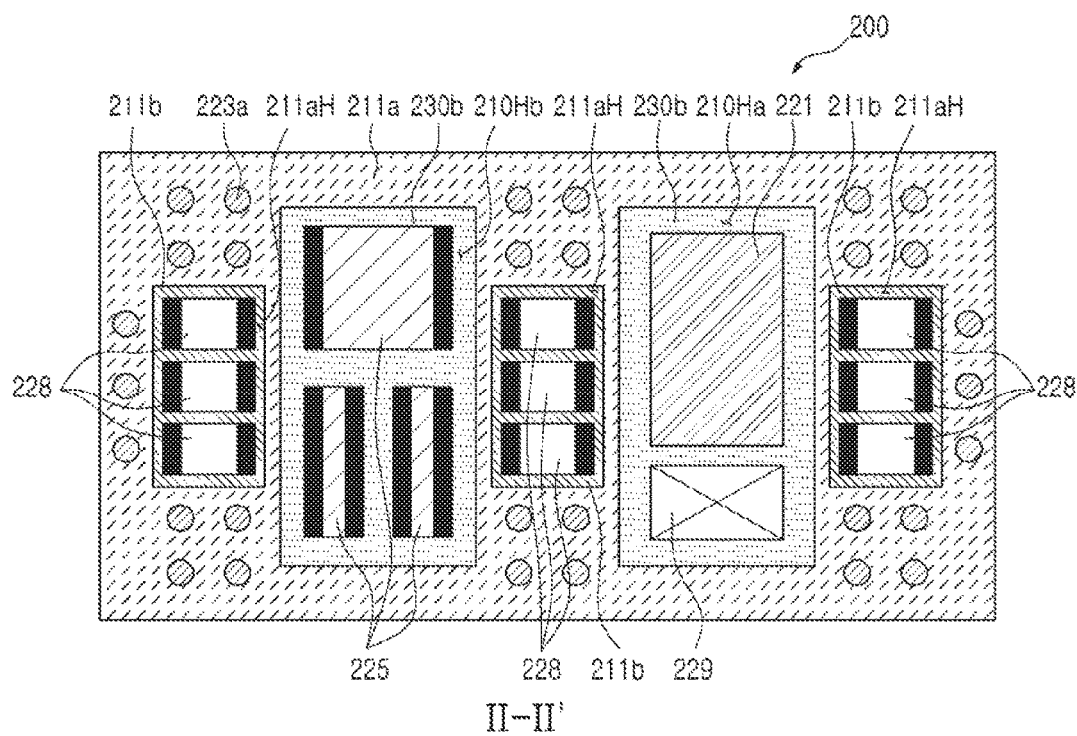
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Referring to the drawings, a fan-out semiconductor package 200 according to another exemplary embodiment in the present disclosure may include a first encapsulant 230a disposed on a first connection member 210 and having a plurality of through-holes connected to first and second through-holes 210Ha and 210Hb and a second encapsulant 230b disposed on the first encapsulant 230a and encapsulating at least portions of second passive components 225 and an inactive surface of a semiconductor chip 220, as encapsulants 230a and 230b. The first connection member 210 in a state in which it is connected to the first encapsulant 230a may have an asymmetrical shape. The first and second encapsulants 230a and 230b may include the same or different insulating materials. The first encapsulant 230a may include the same insulating material as that of a second insulating layer 211b of the first connection member 210. In this case, a boundary between the first encapsulant 230a and the second insulating layer 211b may not be apparent.

A description of other configurations such as the first connection member 210, insulating layers 211a, 211b, and 211c, redistribution layers 212a1, 212a2, 212b, and 212c, and vias 213a, 213b, and 213c constituting the first connection member 210, a through-hole 211aH of the insulating layer 211a, the semiconductor chip 220 having a body 221 and connection pads 222, passive components 225 and 228 having different thicknesses, a second connection member 240, insulating layers 241, redistribution layers 242, and vias 243 constituting the second connection member 240, a heat dissipation part 245 formed in the second connection member 240, a passivation layer 250, an underbump metal layer, connection terminals, a pattern layer 232, vias 233, an electronic component 229, and the like, or detailed descriptions of respective configurations overlapping descriptions provided above will be omitted.

FIGS. 14A through 14D are schematic views illustrating an example of processes of manufacturing the fan-out semiconductor package of FIG. 12.

Figure 14A:
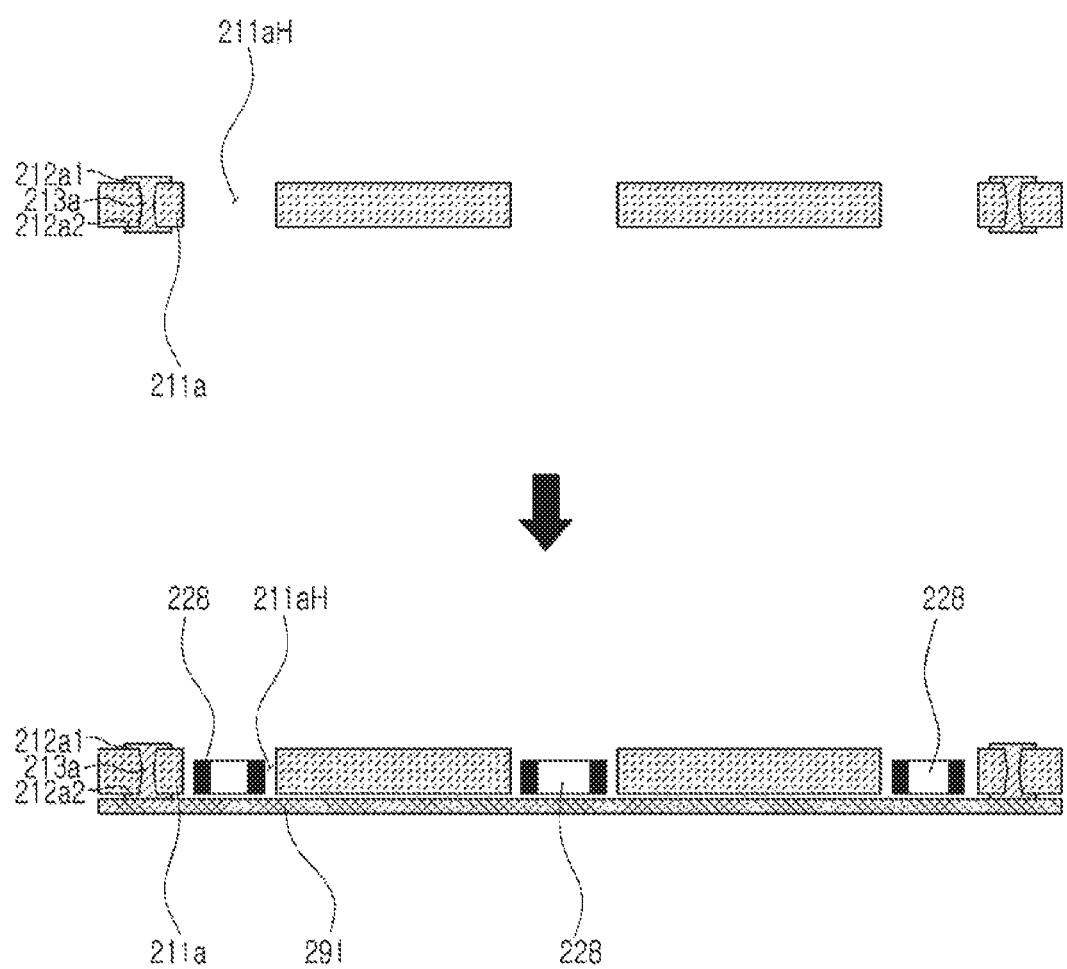
FIGS. 14A through 14D are schematic views illustrating an example of processes of manufacturing the fan-out semiconductor package of FIG. 12.

Referring to FIG. 14A, a first insulating layer 211a having the through-hole 211aH and having first and second redistribution layers 212a1 and 212a2 disposed on opposite surfaces thereof, respectively, and having first vias 213a formed therein may be prepared. Then, an adhesive film 291 may be attached to the first insulating layer 211a. Then, first passive components 228 may be attached to the adhesive film 291 exposed through the through-hole 211aH.

Figure 14B:
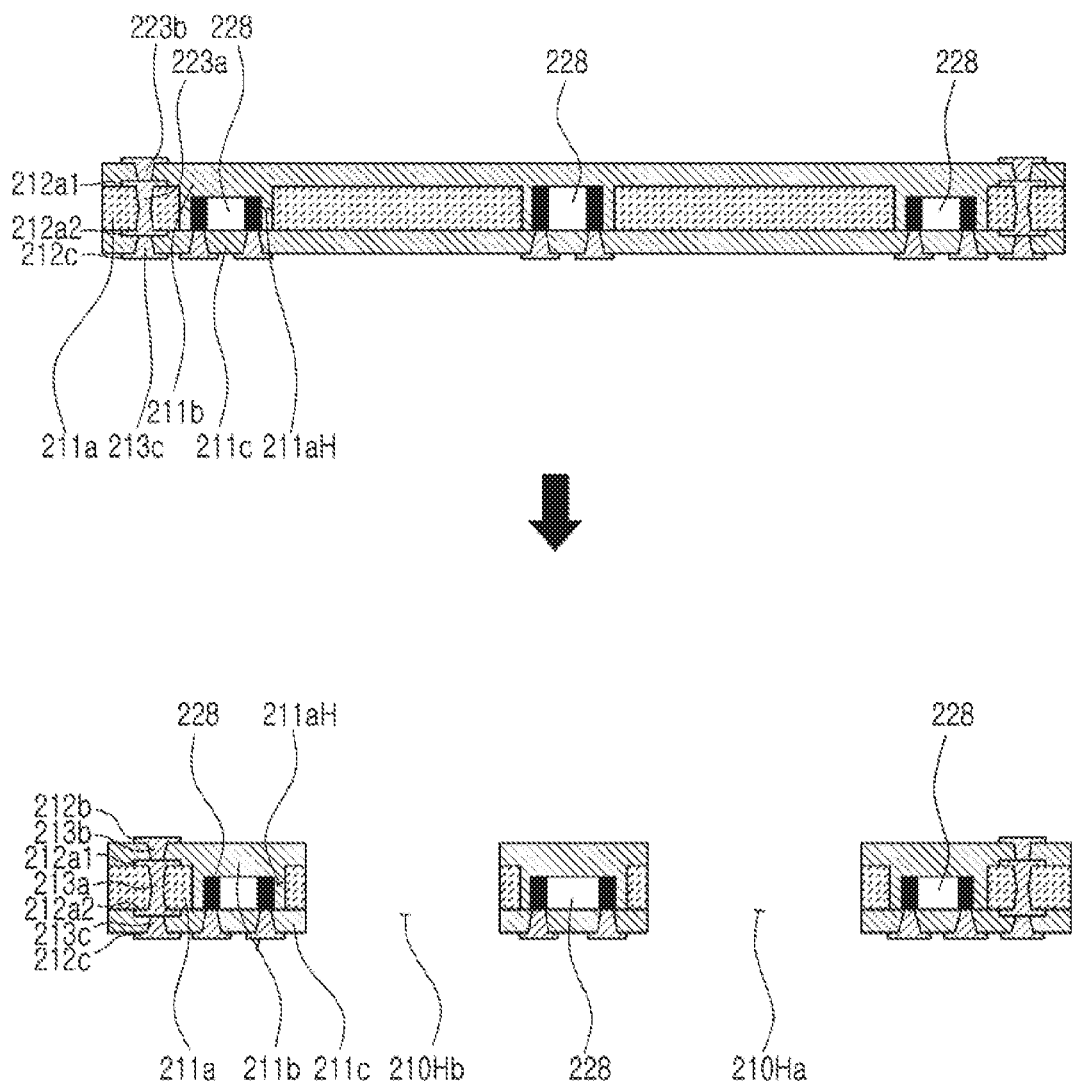

Then, referring to FIG. 14B, a second insulating layer 211b may be formed on the adhesive film 291 to encapsulate at least portions of the first passive components 228. Then, the adhesive film 291 may be peeled off, and a third insulating layer 211c may be formed in a region in which the adhesive film 291 is peeled off. Then, third and fourth redistribution layers 212b and 212c may be formed on the second and third insulating layers 211b and 211c, respectively, and second and third vias 213b and 213c may be formed in the second and third insulating layers 211b and 211c, respectively. In addition, first and second through-holes 210Ha and 210Hb may be formed.

Figure 14C:
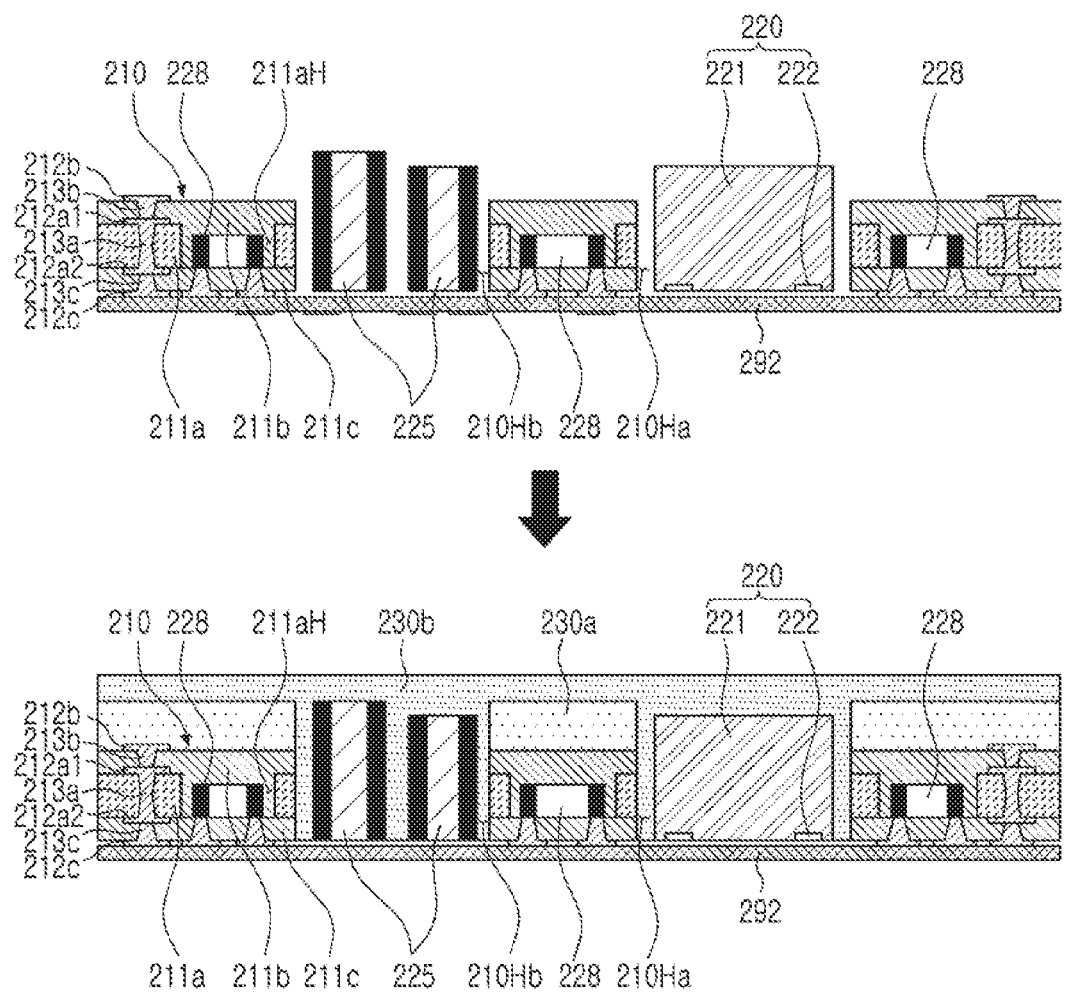

Then, referring to FIG. 14C, the manufactured first connection member 210 having the first and second through-holes 210Ha and 210Hb may be attached to an adhesive film 292. Then, second passive components 225 and the semiconductor chip 220 may be attached to the adhesive film 292 exposed through the first and second through-holes 210Ha and 210Hb. Then, the first encapsulant 230a may be formed on the first connection member 210. Then, the second passive components 225 and the semiconductor chip 220 may be encapsulated using the second encapsulant 230b. Then, the adhesive film 292 may be peeled off, and the insulating layer 241, the redistribution layer 242, and the vias 243 may be formed in a region in which the adhesive film 292 is peeled off.

Figure 14D:
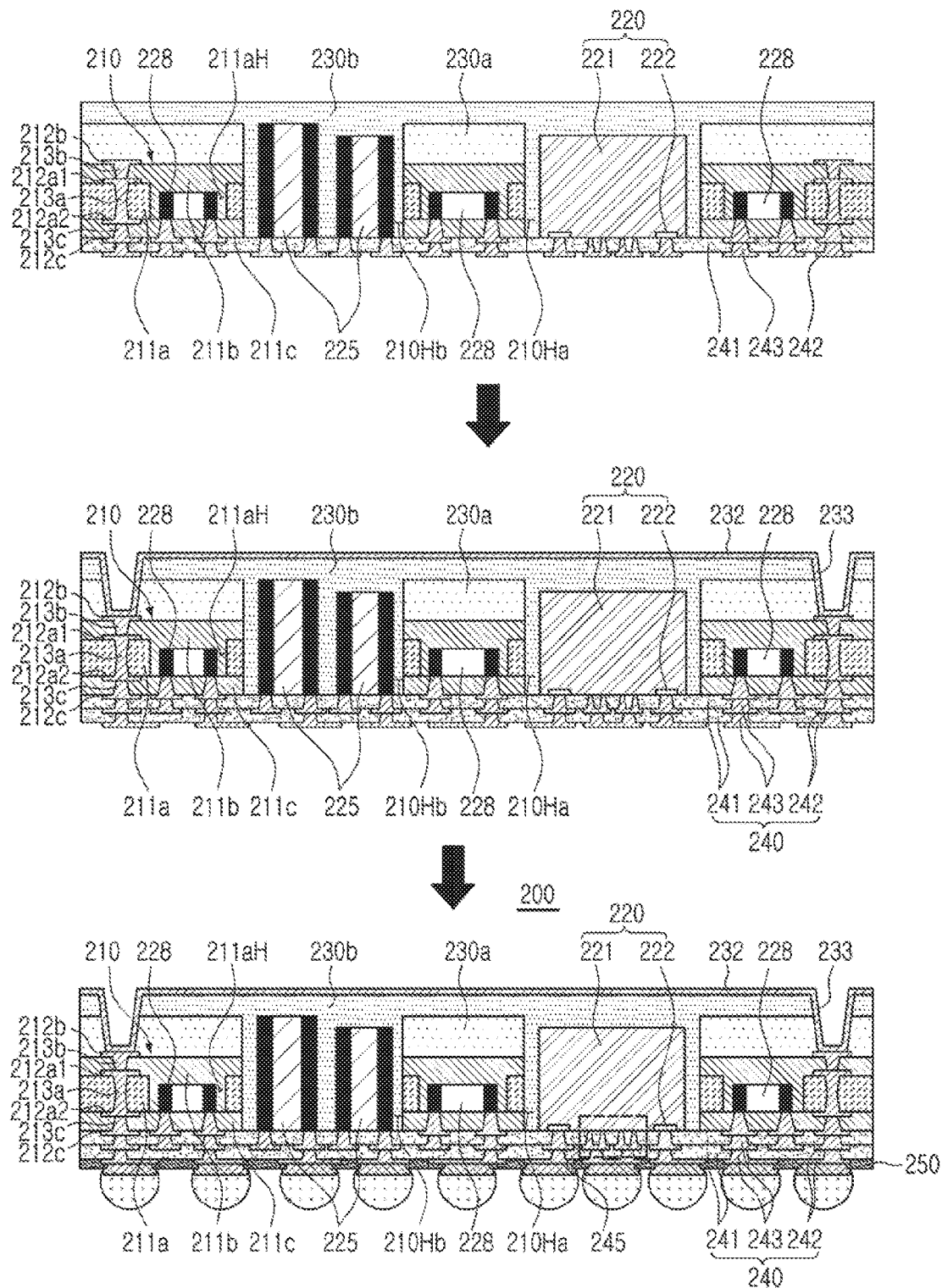

Then, referring to FIG. 14D, the insulating layer 241, the redistribution layer 242, and the vias 243 may further be formed once or more, if necessary. In addition, the pattern layer 232 and the vias 233 may be formed. Then, the passivation layer 250, the underbump metal layer 260, and the connection terminals 270 may be sequentially formed. The fan-out semiconductor package 200 may be manufactured through a series of processes. Detailed contents for the respective processes overlap those described above, and are thus omitted.

Figure 15:
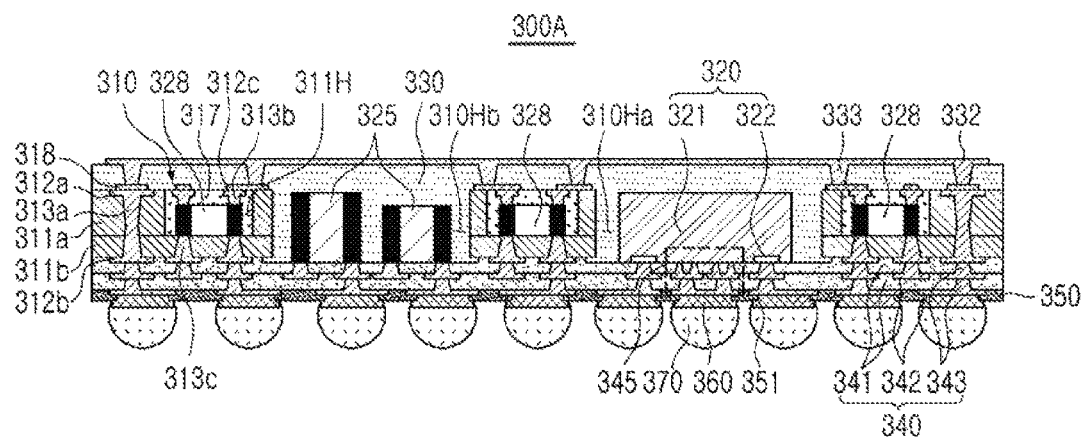
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 300A according to another exemplary embodiment in the present disclosure, a first connection member 310 may include a first insulating layer 311a, a first redistribution layer 312a embedded in the first insulating layer 311a so that at least one surface thereof is exposed externally of the first insulating layer 311a, a second insulating layer 311b disposed on the other surface of the first insulating layer 311a opposing one surface of the first insulating layer 311a in which the first redistribution layer 312a is embedded, and a second redistribution layer 312b disposed on the second insulating layer 311b. The first redistribution layer 312a and the second redistribution layer 312b may be electrically connected to each other by first vias 313a penetrating through the first insulating layer 311a and the second insulating layer 311b. The first insulating layer 311a may have a through-hole 311H, and first passive components 328 may be disposed in the through-hole 311H. The second insulating layer 311b may support the first passive components 328. At least portions of the first passive components 328 may be encapsulated by a resin layer 317 filling at least portions of the through-hole 311H. The first passive components 328 may be electrically connected to redistribution layers 342 of a second connection member 340 through vias 313c penetrating through the second insulating layer 311b. The first passive components 328 may be electrically connected to an upper portion of the fan-out semiconductor package 300A through vias 313b penetrating through the resin layer 317 and embedded patterns 312c embedded in the resin layer 317. Connection patterns 318 may be disposed on the first redistribution layer 312a embedded in the first insulating layer 311a or the embedded patterns 312c embedded in the resin layer 317. The first insulating layer 311a and the second insulating layer 311b may include the same insulating materials, but are not limited thereto. Meanwhile, the first connection member 310 may also be disposed so that the first insulating layer 311a is adjacent to the second connection member 340 and the second insulating layer 311b is adjacent to an encapsulant 330. That is, the fan-out semiconductor package 300A may also be used in a state in which it is rotated by 180° from a form illustrated in the drawing.

A description of other configurations such as a semiconductor chip 320 having a body 321 and connection pads 322, passive components 325 and 328 having different thicknesses, the second connection member 340, insulating layers 341, redistribution layers 342, and vias 343 constituting the second connection member 340, a heat dissipation part 345 formed in the second connection member 340, a passivation layer 350, an underbump metal layer 360, connection terminals 370, a pattern layer 332, vias 333, and the like, or detailed descriptions of respective configurations overlapping descriptions provided above will be omitted.

Figure 16:
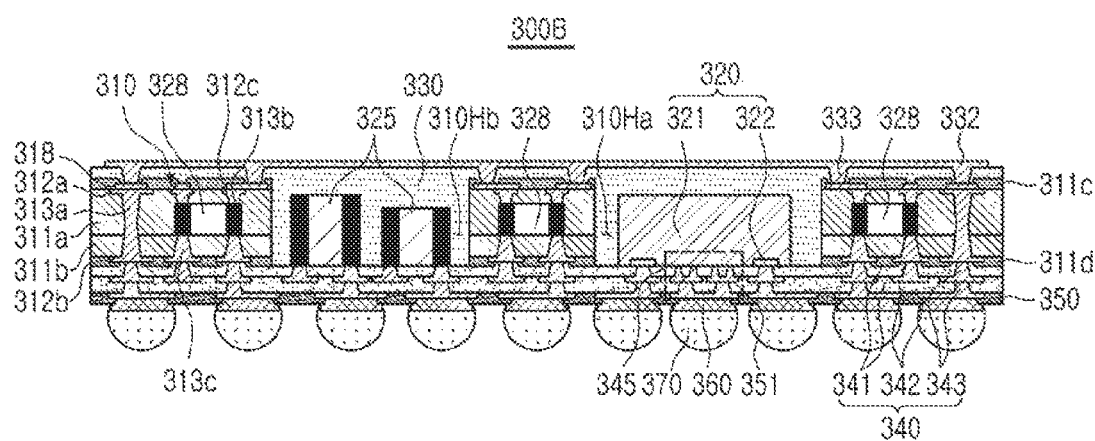
FIG. 16 is a schematic cross-sectional view illustrating another example of a fan-out semiconductor package.

FIG. 16 is a schematic cross-sectional view illustrating another example of a fan-out semiconductor package.

Referring to the drawing, in a fan-out semiconductor package 300B according to another exemplary embodiment in the present disclosure, the first connection member 310 may further include a third insulating layer 311c disposed on the first insulating layer 311a and a fourth insulating layer 311d disposed on the second insulating layer 311b, unlike the fan-out semiconductor package 300A described above. The third insulating layer 311c and the fourth insulating layer 311d may have openings exposing at least portions of the connection patterns 318 and the second redistribution layer 312b, respectively. The third insulating layer 311c and the fourth insulating layer 311d may include insulating materials different from those of the first insulating layer 311a and the second insulating layer 311b, but are not limited thereto. The first insulating layer 311a may not have a through-hole, and the first passive components 328 may be embedded in the first insulating layer 311a and/or the second insulating layer 311b depending on thicknesses thereof.

A description of other configurations or detailed descriptions of respective configurations overlapping descriptions provided above will be omitted.

Figure 17:
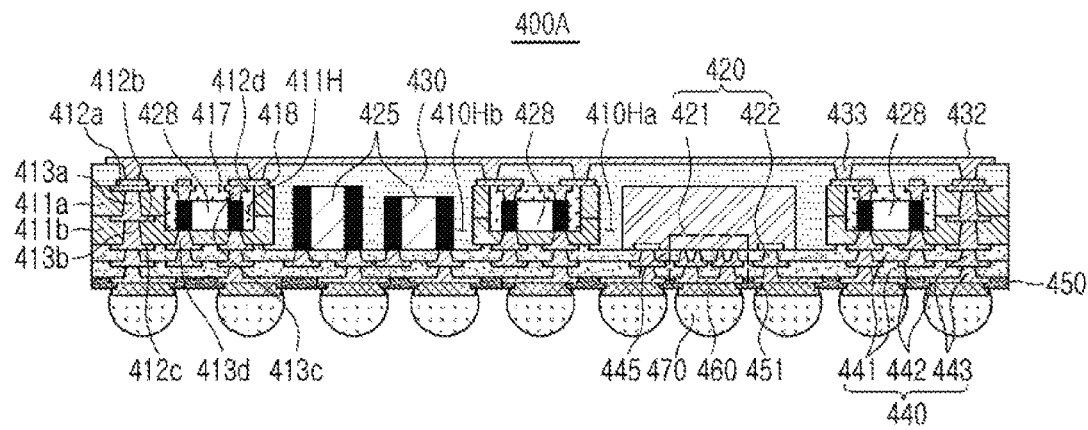
FIG. 17 is a schematic cross-sectional view illustrating another example of a fan-out semiconductor package.

FIG. 17 is a schematic cross-sectional view illustrating another example of a fan-out semiconductor package.

Referring to the drawing, in a fan-out semiconductor package 400A according to another exemplary embodiment in the present disclosure, a first connection member 410 may include a first insulating layer 411a, a first redistribution layer 412a embedded in the first insulating layer 411a so that at least one surface thereof is exposed externally of the first insulating layer 411a, a second redistribution layer 412b disposed on the other surface of the first insulating layer 411a opposing one surface of the first insulating layer 411a in which the first redistribution layer 412a is embedded, a second insulating layer 411b disposed on the other surface of the first insulating layer 411a opposing one surface of the first insulating layer 411a in which the first redistribution layer 412a is embedded and covering the second redistribution layer 412b, and a third redistribution layer 412c disposed on the second insulating layer 411b. The first redistribution layer 412a and the second redistribution layer 412b may be electrically connected to each other by first vias 413a penetrating through the first insulating layer 411a. The second redistribution layer 412b and the third redistribution layer 412c may be electrically connected to each other by second vias 413b penetrating through the second insulating layer 411b. The first insulating layer 411a may have a through-hole 411H, and first passive components 428 may be disposed in the through-hole 411H. The through-hole 411H may also penetrate through a portion of the second insulating layer 411b, and the first passive components 428 may be supported by the second insulating layer 411b. At least portions of the first passive components 428 may be encapsulated by a resin layer 417 filling at least portions of the through-hole 411H. The first passive components 428 may be electrically connected to redistribution layers 442 of a second connection member 440 through vias 413d penetrating through the second insulating layer 411b. The first passive components 428 may be electrically connected to an upper portion of the fan-out semiconductor package 400A through vias 413c penetrating through the resin layer 417 and embedded patterns 412d embedded in the resin layer 417. Connection patterns 418 may be disposed on the first redistribution layer 412a embedded in the first insulating layer 411a or the embedded patterns 412d embedded in the resin layer 417. The first insulating layer 411a and the second insulating layer 411b may include the same insulating materials, but are not limited thereto. Meanwhile, the first connection member 410 may also be disposed so that the first insulating layer 411a is adjacent to the second connection member 440 and the second insulating layer 411b is adjacent to an encapsulant 430. That is, the fan-out semiconductor package 400A may also be used in a state in which it is rotated by 180° from a form illustrated in the drawing.

A description of other configurations such as a semiconductor chip 420 having a body 421 and connection pads 422, passive components 425 and 428 having different thicknesses, the second connection member 440, insulating layers 441, redistribution layers 442, and vias 444 constituting the second connection member 440, a heat dissipation part 445 formed in the second connection member 440, a passivation layer 450, an underbump metal layer 460, connection terminals 470, a pattern layer 432, vias 433, and the like, or detailed descriptions of respective configurations overlapping descriptions provided above will be omitted.

Figure 18:
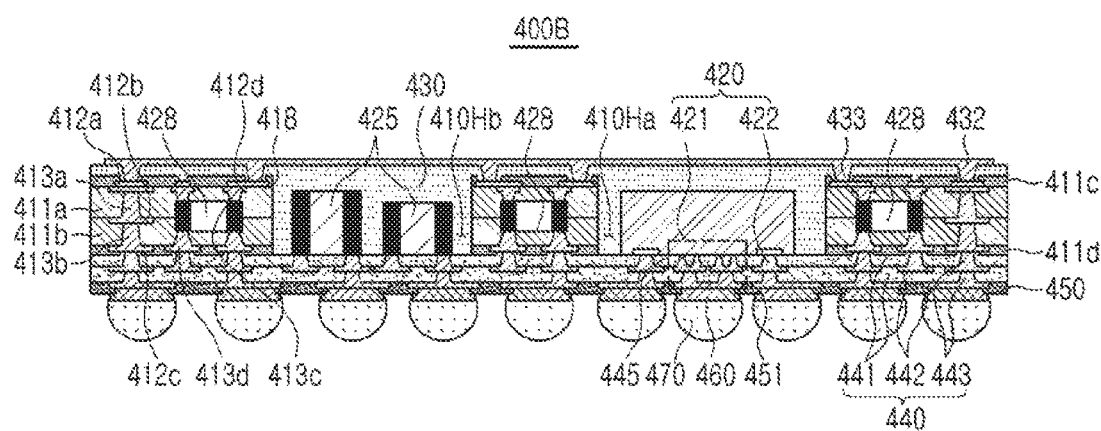
FIG. 18 is a schematic cross-sectional view illustrating another example of a fan-out semiconductor package.

FIG. 18 is a schematic cross-sectional view illustrating another example of a fan-out semiconductor package.

Referring to the drawing, in a fan-out semiconductor package 400B according to another exemplary embodiment in the present disclosure, the first connection member 410 may further include a third insulating layer 411c disposed on the first insulating layer 411a and a fourth insulating layer 411d disposed on the second insulating layer 411b, unlike the fan-out semiconductor package 400A described above. The third insulating layer 411c and the fourth insulating layer 411d may have openings exposing at least portions of the connection patterns 418 and the third redistribution layer 412b, respectively. The third insulating layer 411c and the fourth insulating layer 411d may include insulating materials different from those of the first insulating layer 411a and the second insulating layer 411b, but are not limited thereto. The first insulating layer 411a may not have a through-hole, and the first passive components 428 may be embedded in the first insulating layer 411a and/or the second insulating layer 411b depending on thicknesses thereof.

A description of other configurations or detailed descriptions of respective configurations overlapping descriptions provided above will be omitted.

Figure 19:
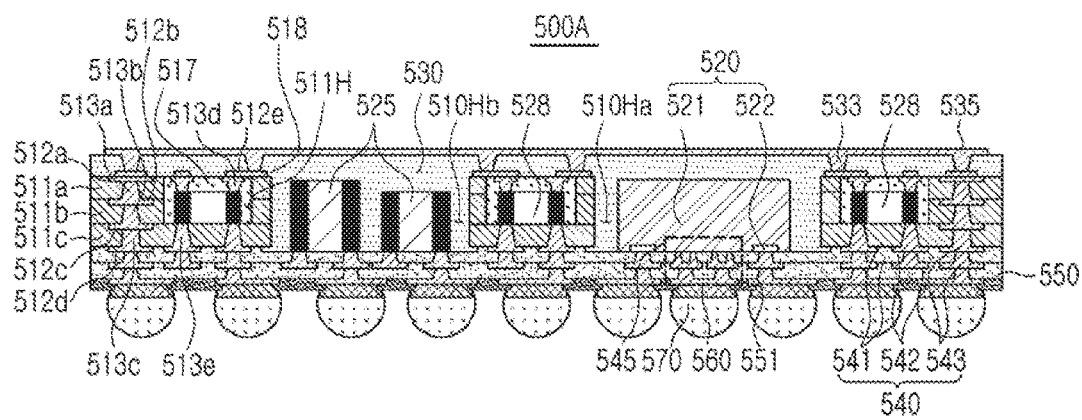
FIG. 19 is a schematic cross-sectional view illustrating another example of a fan-out semiconductor package.

FIG. 19 is a schematic cross-sectional view illustrating another example of a fan-out semiconductor package.

Referring to the drawing, in a fan-out semiconductor package 500A according to another exemplary embodiment in the present disclosure, a first connection member 510 may include a first insulating layer 511a, a first redistribution layer 512a embedded in the first insulating layer 511a so that at least one surface thereof is exposed externally of the first insulating layer 511a, a second redistribution layer 512b disposed on the other surface of the first insulating layer 511a opposing one surface of the first insulating layer 511a in which the first redistribution layer 512a is embedded, a second insulating layer 511b disposed on the other surface of the first insulating layer 511a opposing one surface of the first insulating layer 511a in which the first redistribution layer 512a is embedded and covering the second redistribution layer 512b, a third redistribution layer 512c disposed on the second insulating layer 511b, a third insulating layer 511c disposed on the second insulating layer 511b and covering the third redistribution layer 512c, and a fourth redistribution layer 512d disposed on the third insulating layer 511c. The first redistribution layer 512a and the second redistribution layer 512b may be electrically connected to each other by first vias 513a penetrating through the first insulating layer 511a. The second redistribution layer 512b and the third redistribution layer 512c may be electrically connected to each other by second vias 513b penetrating through the second insulating layer 511b. The third redistribution layer 512c and the fourth redistribution layer 512d may be electrically connected to each other by third vias 513c penetrating through the third insulating layer 511c. The first insulating layer 511a and the second insulating layer 511b may have a through-hole 511H, and first passive components 528 may be disposed in the through-hole 511H. The first passive components 528 may be supported by the third insulating layer 511c. At least portions of the first passive components 528 may be encapsulated by a resin layer 517 filling at least portions of the through-hole 511H. The first passive components 528 may be electrically connected to redistribution layers 542 of a second connection member 540 through vias 513e penetrating through the third insulating layer 511c. The first passive components 528 may be electrically connected to an upper portion of the fan-out semiconductor package 500A through vias 513d penetrating through the resin layer 517 and embedded patterns 512e embedded in the resin layer 517. Connection patterns 518 may be disposed on the first redistribution layer 512a embedded in the first insulating layer 511a or the embedded patterns 512e embedded in the resin layer 517. The first insulating layer 511a, the second insulating layer 511b, and the third insulating layer 511c may include the same insulating materials, but are not limited thereto. Meanwhile, the first connection member 510 may also be disposed so that the first insulating layer 511a is adjacent to the second connection member 540 and the third insulating layer 511c is adjacent to an encapsulant 530. That is, the fan-out semiconductor package 500A may also be used in a state in which it is rotated by 180° from a form illustrated in the drawing.

A description of other configurations such as a semiconductor chip 520 having a body 521 and connection pads 522, passive components 525 and 528 having different thicknesses, the second connection member 540, insulating layers 541, redistribution layers 542, and vias 543 constituting the second connection member 540, a heat dissipation part 545 formed in the second connection member 540, a passivation layer 550, an underbump metal layer 560, connection terminals 570, a pattern layer 532, vias 533, and the like, or detailed descriptions of respective configurations overlapping descriptions provided above will be omitted.

Figure 20:
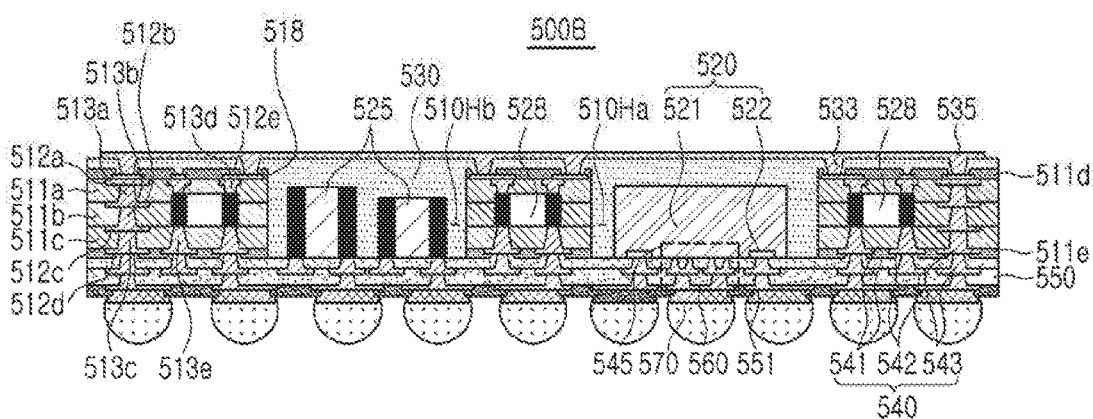
FIG. 20 is a schematic cross-sectional view illustrating another example of a fan-out semiconductor package.

FIG. 20 is a schematic cross-sectional view illustrating another example of a fan-out semiconductor package.

Referring to the drawing, in a fan-out semiconductor package 500B according to another exemplary embodiment in the present disclosure, the first connection member 510 may further include a fourth insulating layer 511d disposed on the first insulating layer 511a and a fifth insulating layer 511e disposed on the third insulating layer 511c, unlike the fan-out semiconductor package 500A described above. The fourth insulating layer 511d and the fifth insulating layer 511e may have openings exposing at least portions of the connection patterns 518 and the fourth redistribution layer 512d, respectively. The fourth insulating layer 511d and the fifth insulating layer 511e may include insulating materials different from those of the first insulating layer 511a, the second insulating layer 511b, and the third insulating layer 511c, but are not limited thereto. The first insulating layer 511a and the second insulating layer 511b may not have a through-hole, and the first passive components 528 may be embedded in the first insulating layer 511a and/or the second insulating layer 511b depending on thicknesses thereof.

A description of other configurations or detailed descriptions of respective configurations overlapping descriptions provided above will be omitted.

As set forth above, according to the exemplary embodiments in the present disclosure, a fan-out semiconductor package in which a plurality of passive components may be mounted together with a semiconductor chip, a size and a thickness of the package may be significantly reduced even in the case that the plurality of passive components are mounted together with the semiconductor chip, and manufacturing costs and a defect rate may be significantly reduced may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a core member having a first through-hole;
   a semiconductor chip disposed in the first through-hole of the core member and having an active surface having connection pads disposed therein and an inactive surface opposing the active surface;
   an encapsulant encapsulating at least portions of the core member and the inactive surface of the semiconductor chip;
   a connection member disposed on the core member and the active surface of the semiconductor chip and including a redistribution layer electrically connected to the connection pads of the semiconductor chip;
   a metal layer disposed on walls of the first through-hole of the core member and extending to at least one surface of the first connection member;
   an electromagnetic interference (EMI) shielding layer disposed on the encapsulant and covering at least the inactive surface of the semiconductor chip; and
   vias penetrating through the encapsulant and connecting the EMI shielding layer to the metal layer.

2. The fan-out semiconductor package of claim 1, wherein the metal layer and the EMI shielding layer are electrically connected to ground patterns formed in the fan-out semiconductor package.

3. The fan-out semiconductor package of claim 1, wherein the connection member further includes a heat dissipation vias connected to the active surface of the semiconductor chip.

4. The fan-out semiconductor package of claim 1, wherein the core member further has a second through-hole, and
   a second passive component is disposed in the second through-hole.

5. The fan-out semiconductor package of claim 4, wherein a first passive component is disposed in the core member, and
   the second passive component has a thickness greater than that of the first passive component.

6. The fan-out semiconductor package of claim 5, wherein a lower surface of the first passive component is disposed on a level above a lower surface of the second passive component, with respect to the connection member.

7. The fan-out semiconductor package of claim 1, further comprising an electronic component disposed in the first through-hole.

8. The fan-out semiconductor package of claim 7, wherein the electronic component is at least one of an integrated circuit, a passive component, or a dummy chip.

9. The fan-out semiconductor package of claim 1, wherein the core member includes an insulating layer, a first redistribution layer and a second redistribution layer disposed on opposite surfaces of the first insulating layer, respectively, and
   the first and second redistribution layers of the core member are electrically connected to the connection pads of the semiconductor chip through the redistribution layer of the connection member.

10. The fan-out semiconductor package of claim 1, wherein the encapsulant includes a first encapsulant disposed on the core member and having a through-hole overlapping the first through-hole of the core member in a direction along which the semiconductor chip and the connection member are stacked, and a second encapsulant disposed on the first encapsulant and encapsulating at least portions of the semiconductor chip.

* * * * *